United States Patent
Fox

(10) Patent No.: US 12,328,557 B2
(45) Date of Patent: *Jun. 10, 2025

(54) DEVICES AND METHODS FOR CONTROLLING AUDIO OUTPUT IN A TELEMATICS SYSTEM

(71) Applicant: Geotab Inc., Oakville (CA)

(72) Inventor: Stephen Michael Fox, Oakville (CA)

(73) Assignee: Geotab Inc., Oakville (CA)

( * ) Notice: Subject to any disclaimer, the term of this patent is extended or adjusted under 35 U.S.C. 154(b) by 244 days.

This patent is subject to a terminal disclaimer.

(21) Appl. No.: 18/136,437

(22) Filed: Apr. 19, 2023

(65) Prior Publication Data

US 2023/0367540 A1    Nov. 16, 2023

Related U.S. Application Data

(60) Provisional application No. 63/342,371, filed on May 16, 2022.

(51) Int. Cl.
| | | |
|---|---|---|
| *H04R 3/04* | (2006.01) | |
| *G06F 3/16* | (2006.01) | |
| *G08B 3/10* | (2006.01) | |
| *G10L 13/02* | (2013.01) | |

(52) U.S. Cl.
CPC .............. *H04R 3/04* (2013.01); *G06F 3/165* (2013.01); *G08B 3/10* (2013.01); *G10L 13/02* (2013.01); *H04R 2430/01* (2013.01); *H04R 2499/13* (2013.01)

(58) Field of Classification Search
CPC .. H04R 3/04; H04R 2430/01; H04R 2499/13; H04R 2410/05; H04R 3/12; G06F 3/165; G08B 3/10; G10L 13/02; H03G 3/24; H03G 3/26; H03G 3/3005

See application file for complete search history.

(56) References Cited

U.S. PATENT DOCUMENTS

| | | | | |
|---|---|---|---|---|
| 4,401,848 | A | * | 8/1983 | Tsunoda .............. B60R 16/0373 381/86 |
| 6,360,187 | B1 | * | 3/2002 | Hermann ................. H03G 3/32 702/191 |
| 6,512,465 | B2 | | 1/2003 | Flick |
| 6,741,187 | B2 | | 5/2004 | Flick |
| 6,744,384 | B2 | | 6/2004 | Flick |
| 6,756,885 | B1 | | 6/2004 | Flick |
| 6,784,809 | B2 | | 8/2004 | Flick |

(Continued)

FOREIGN PATENT DOCUMENTS

CA    2793865 C    3/2018

OTHER PUBLICATIONS

EESR mailed on Oct. 11, 2023.

*Primary Examiner* — Akelaw Teshale
(74) *Attorney, Agent, or Firm* — Sherif A. Abdel-Kader

(57) ABSTRACT

Devices and methods for controlling audio output in a telematics system are provided. In on method a telematics device determines that a parameter has exceeded a first threshold and sends an automatic volume control trigger message to an audio output device. The telematics device determines that a second parameter has exceeded a second threshold and sends an alert message to the audio output device. The audio output device performs an automatic volume control procedure then plays back and audible alert message.

17 Claims, 16 Drawing Sheets

(56) References Cited

U.S. PATENT DOCUMENTS

| | | |
|---|---|---|
| 6,798,356 B2 | 9/2004 | Flick |
| 6,803,861 B2 | 10/2004 | Flick |
| 6,844,827 B2 | 1/2005 | Flick |
| 6,888,495 B2 | 5/2005 | Flick |
| 6,946,954 B2 * | 9/2005 | Piech .................. B60C 23/0408 73/146 |
| 6,957,133 B1 | 10/2005 | Hunt et al. |
| 6,972,667 B2 | 12/2005 | Flick |
| 7,257,396 B2 | 8/2007 | Olsen et al. |
| 7,647,147 B2 | 1/2010 | Fortin et al. |
| 7,671,727 B2 | 3/2010 | Flick |
| 7,683,774 B2 | 3/2010 | Olsen et al. |
| 8,032,278 B2 | 10/2011 | Flick |
| 8,836,489 B2 * | 9/2014 | Christensen .......... B60R 25/102 701/32.4 |
| 9,141,266 B2 * | 9/2015 | McCormick ........ G06F 3/04842 |
| 9,679,487 B1 * | 6/2017 | Hayward ......... G08G 1/096827 |
| 9,754,426 B2 | 9/2017 | Meyer et al. |
| 9,872,225 B2 | 1/2018 | Guba et al. |
| 9,886,800 B2 | 2/2018 | Groβ |
| 9,981,615 B2 | 5/2018 | Flick |
| 9,981,616 B2 | 5/2018 | Flick |
| 10,089,868 B1 | 10/2018 | Hayward |
| 10,200,786 B1 * | 2/2019 | Friedrich ................. H04R 3/00 |
| 10,255,575 B2 | 4/2019 | Warkentin et al. |
| 11,127,226 B2 | 9/2021 | Zucconelli et al. |
| 11,140,236 B2 | 10/2021 | Davis et al. |
| 11,310,069 B2 | 4/2022 | Xiao et al. |
| 11,542,001 B1 | 1/2023 | Parodi et al. |
| 11,710,355 B1 | 7/2023 | Wenneman et al. |
| 11,736,312 B1 | 8/2023 | Xiao et al. |
| 11,741,760 B1 | 8/2023 | Dubin et al. |
| 11,756,346 B1 | 9/2023 | Wu et al. |
| 11,780,446 B1 | 10/2023 | Srinivasan et al. |
| 11,787,413 B2 | 10/2023 | Tsai et al. |
| 11,847,911 B2 | 12/2023 | Eihattab et al. |
| 2006/0261944 A1 | 11/2006 | Ng et al. |
| 2008/0319602 A1 * | 12/2008 | McClellan ............. G07C 5/085 701/31.4 |
| 2009/0245533 A1 * | 10/2009 | Gerlach .................... H03G 3/32 381/86 |
| 2011/0001638 A1 * | 1/2011 | Pudar ...................... G08G 1/20 340/988 |
| 2011/0291823 A1 * | 12/2011 | Christensen .......... B60R 25/102 340/426.1 |
| 2013/0147617 A1 | 6/2013 | Boling et al. |
| 2014/0111354 A1 * | 4/2014 | Hergesheimer ........ G07C 5/008 340/870.02 |
| 2016/0159173 A1 * | 6/2016 | Schneider .............. G08B 19/00 701/400 |
| 2017/0147420 A1 * | 5/2017 | Cawse ................ G06F 11/0748 |
| 2018/0182182 A1 | 6/2018 | Meyer et al. |
| 2018/0326150 A1 | 11/2018 | Davis et al. |
| 2020/0130577 A1 * | 4/2020 | Mitra ....................... B60Q 9/00 |
| 2022/0014601 A1 | 1/2022 | Davis et al. |
| 2022/0044500 A1 | 2/2022 | Yang et al. |
| 2022/0237958 A1 | 7/2022 | Tzamaloukas et al. |
| 2023/0171314 A1 | 6/2023 | Onti Srinivasan et al. |
| 2023/0241942 A1 * | 8/2023 | Hornstein ............... B60H 1/008 454/165 |
| 2024/0157958 A1 * | 5/2024 | Shi ....................... G06V 20/588 |

* cited by examiner

DEVICES AND METHODS FOR CONTROLLING AUDIO OUTPUT IN A TELEMATICS SYSTEM

FIELD

The present disclosure generally relates to vehicle telematics, and more specifically to devices and methods for controlling audio output in a telematics system.

BACKGROUND

A telematics system may gather asset data using a telematics device. The telematics device may be integrated into or located onboard the asset. The asset may be a vehicle ("vehicular asset") or some stationary equipment. The telematics device may collect the asset data from the asset through a data connection with the asset. In the case of a vehicular asset, the telematics device may gather the asset data through an onboard diagnostic port (OBD). The gathered asset data may include engine revolutions-per-minute (RPM), battery voltage, fuel level, tire pressure, oil temperature, or any other asset data available through the diagnostic port. Additionally, the telematics device may gather sensor data pertaining to the asset via sensors on the telematics device. For example, the telematics device may have temperature and pressure sensors, inertial measurement units (IMU), optical sensors, and the like. Furthermore, the telematics device may gather location data pertaining to the asset from a location module on the telematics device. When the telematics device is coupled to the asset, the gathered sensor data and location data pertain to the asset. The gathered asset data, sensor data and location data may be received and recorded by a technical infrastructure of the telematics system, such as a telematics server, and used in the provision of fleet management tools, for telematics services, or for further data analysis.

SUMMARY

In one aspect of the present disclosure, there is provided a method in a telematics device coupled to a vehicle. The method comprises determining that a first parameter of a first type exceeds a first threshold, in response to determining that the first parameter is greater than the first threshold sending an automatic volume control trigger message to an audio output device coupled to the telematics device, determining that a second parameter of a second type exceeds a second threshold, and in response to determining that the second parameter exceeds the second threshold, sending an alert message to the audio output device. Advantageously, the audio output device receives the automatic volume control trigger message before the alert message thus providing the audio output device with an opportunity to perform an automatic volume control procedure.

The second type may be the same as the first type. Alternatively, the second type may be different from the first type. For example, the first time may be a vehicle operating parameter and the second type may be time. Alternatively, the first type and the second type may both be the same vehicle parameter.

Determining that the first parameter exceeds the first threshold may comprise determining that a value of the first parameter is greater than the first threshold.

Determining that the first parameter exceeds the first threshold may comprise determining that a value of the first parameter is lower than the first threshold.

Determining that the second parameter exceeds the second threshold may comprise determining that the second parameter exceeds the first threshold, when the second type is the same as the first type.

Determining that the first parameter exceeds the first threshold may comprise receiving the first parameter and comparing the first parameter against the first threshold.

Determining that the second parameter exceeds the second threshold may comprise receiving the second parameter and comparing the second parameter against the second threshold.

The method may further comprise determining that the first parameter has not dropped below the first threshold in response to determining that the second parameter exceeds the second threshold.

Determining that the first parameter has not dropped below the first threshold may comprise reading the first parameter and comparing the first parameter against the first threshold.

The audio output device may comprise an audio output expander coupled to the telematics device via an input/output expander interface.

Sending an automatic volume control trigger message may comprise sending a message that powers up a plurality of audio components for detecting ambient noise. Advantageously, the audio components for detecting ambient noise are now always powered up thus consuming power and potentially draining a power source, such as a battery. Instead, the audio components for detecting ambient noise are only powered up when there is a potential that an alert message may need to be played on the audio output device.

The plurality of audio components for detecting ambient noise may comprise a microphone and an audio input module.

The message that powers up the plurality of audio components for detecting ambient noise may also invoke an automatic volume control procedure for adjusting an audio output level of the audio output device. Invoking an automatic volume control procedure upon powering up the audio components for detecting ambient noise, serves to adjust the output volume level in advance of the need to play the alert message. This ensures that the alert message is played at an adequate output level that overcomes ambient noise while at the same time not being too loud as to disturb the vehicle operator.

Adjusting the audio output level of the audio output device may comprise adjusting the audio output level of a speech synthesizer that converts the alert message to an audible alert message.

In another aspect of the present disclosure, there is provided a telematics device. The telematics device comprises a controller, an asset interface coupled to the controller, and a memory coupled to the controller. The memory is storing machine-executable instructions which, when executed by the controller, configure the telematics device to determine that a first parameter of a first type exceeds a first threshold, in response to determining that the first parameter is greater than the first threshold, send an automatic volume control trigger message to an audio output device coupled to the telematics device, determine that a second parameter of a second type exceeds a second threshold, and in response to determining that the second parameter exceeds the second threshold, send an alert message to the audio output device. Advantageously, the audio output device receives the automatic volume control trigger message before the alert message thus providing the audio output device with an opportunity to perform an automatic volume control procedure.

In yet another aspect of the present disclosure, there is provided a method in a telematics system including a telematics device and an audio output device coupled to the telematics device. The method comprises determining, by the telematics device, that a first parameter of a first type exceeds a first threshold, in response to determining that the first parameter exceeds the first threshold sending by the telematics device an automatic volume control trigger message to the audio output device, and receiving the automatic volume control trigger message at the audio output device. The method further comprises invoking at the audio output device an automatic volume control procedure in response to receiving the automatic volume control trigger message and determining that a second parameter of a second type exceeds a second threshold. The method additionally comprises determining by the telematics device that the second parameter exceeds the second threshold, sending by the telematics device an alert message to the audio output device in response to receiving the alert message at the audio output device, and playing by the audio output device an audible alert message based on the alert message. Advantageously, the audio output device receives the automatic volume control trigger message before the alert message thus providing the audio output device with an opportunity to perform an automatic volume control procedure.

Invoking the automatic volume control procedure may comprise powering up a plurality of audio devices for detecting ambient noise. Advantageously, the audio components for detecting ambient noise are now always powered up thus consuming power and potentially draining a power source, such as a battery. Instead, the audio components for detecting ambient noise are only powered up when there is a potential that an alert message may need to be played on the audio output device Playing the audible alert message based on the alert message may comprise providing the alert message to a speech synthesizer of the audio output device.

The audio output device may comprise an audio output expander coupled to the telematics device via an input/output expander interface.

In a further aspect of the present disclosure, there is provided a method in an audio playback device connected to a telematics device which is coupled to a vehicle. The method comprises receiving an alert message to be played on the audio playback device, in response to receiving the alert message, powering up a microphone and an audio input module and starting an automatic volume control procedure, and when the automatic volume control procedure is completed, sending the alert message to a speech synthesizer for playback over a speaker coupled to the speech synthesizer.

BRIEF DESCRIPTION OF THE DRAWINGS

Exemplary non-limiting embodiments of the present invention are described with reference to the accompanying drawings in which.

DETAILED DESCRIPTION

Telematics System

Figure 1:
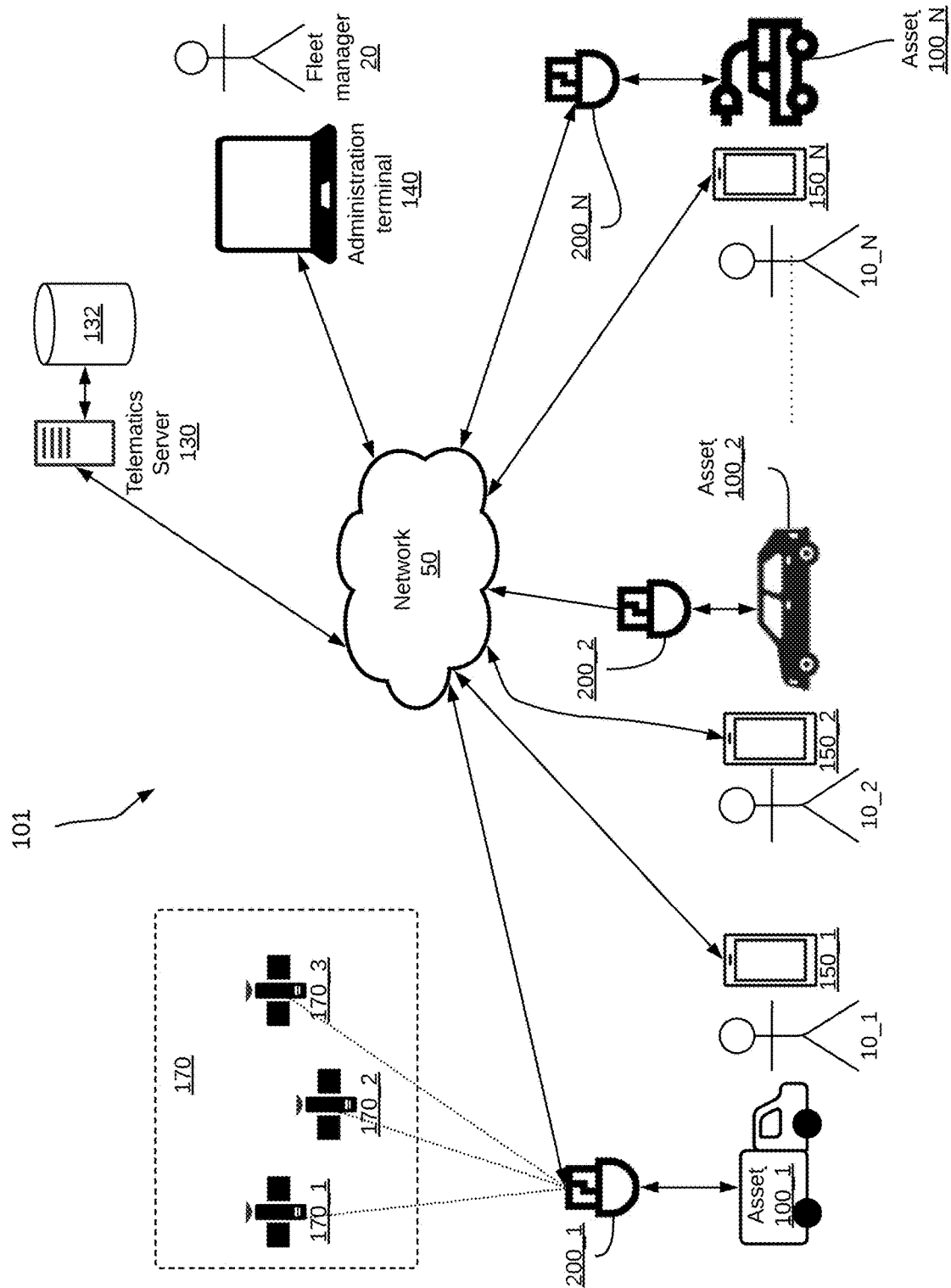
FIG. 1 is a schematic diagram of a telematics system including a plurality of telematics devices coupled to a plurality of assets.

A large telematics system may collect data from a high number of assets, either directly or through telematic devices. A telematics device may refer to a self-contained device installed at an asset, or a telematics device that is integrated into the asset itself. In either case, it may be said that telematics data is being captured or gathered by the telematics device. FIG. 1 shows a high-level block diagram of a telematics system 101. The telematics system 101 includes a telematics server 130, (N) telematics devices shown as telematics device 200_1, telematics device 200_2 . . . through telematics device 200_N ("telematics device 200"), a network 50, administration terminal 140, and operator terminals 150_1, 150_2 . . . through 150_N ("the operator terminals 150"). FIG. 1 also shows a plurality of (N) assets named as asset 100_1, asset 100_2 . . . asset 100_N ("asset 100") coupled to the telematics device 200_1, telematics device 200_2 . . . telematics device 200_N, respectively. Additionally, FIG. 1 shows a plurality of satellites 170_1, 170_2 and 170_3 ("the satellites 170") in communication with the telematics devices 200 for facilitating navigation.

The assets 100 shown are in the form of vehicles. For example, the asset 100_1 is shown as a truck, which may be part of a fleet that delivers goods or provides services. The asset 100_2 is shown as a passenger car that typically runs on an internal combustion engine (ICE). The asset 100_3 is shown as an electric vehicle (EV). Other types of vehicles, which are not shown, are also contemplated in the various embodiments of the present disclosure, including but not limited to, farming vehicles, construction vehicles, military vehicles, and the like.

The telematics devices 200 are electronic devices which are coupled to assets 100 and configured to capture asset data from the assets 100. For example, in FIG. 1 the telematics device 200_1 is coupled to the asset 100_1. Similarly, the telematics device 200_2 is coupled to the asset 100_2 and the telematics device 200_3 is coupled to the asset 100_3. The components of a telematics device 200 are explained in further detail with reference to FIG. 2.

The network 50 may be a single network or a combination of networks such as a data cellular network, the Internet, and other network technologies. The network 50 may provide connectivity between the telematics devices 200 and the telematics server 130, between the administration terminal 140 and the telematics server 130, and between the operator terminals 150 and the telematics server 130.

The telematics server 130 is an electronic device executing machine-executable programming instructions which enable the telematics server 130 to store and analyze telematics data. The telematics server 130 may be a single computer system or a cluster of computers. The telematics server 130 may be running an operating system such as Linux, Windows, Unix, or any other equivalent operating system. Alternatively, the telematics server 130 may be a software component hosted on a cloud service, such as Amazon Web Service (AWS). The telematics server 130 is connected to the network 50 and may receive telematics data from the telematics devices 200. The telematics server 130 may have a plurality of software modules for performing data analysis and analytics on the telematics data to obtain useful asset information about the assets 100. The telematics server 130 may be coupled to a telematics database 132 for storing telematics data and/or the results of the analytics which are related to the assets 100. The asset information stored may include operator information about the operators 10 corresponding to the assets. The telematics server 130 may communicate the asset data and/or the operator information pertaining to an asset 100 to one or more of: the administration terminal 140, and the operator terminal 150.

The satellites 170 may be part of a global navigation satellite system (GNSS) and may provide location information to the telematics devices 200. The location information may be processed by a location module on the telematics device 200 to provide location data indicating the location of the telematics device 200 (and hence the location of the asset 100 coupled thereto). A telematics device 200 that can periodically report an asset's location is often termed an "asset tracking device".

The administration terminal 140 is an electronic device, which may be used to connect to the telematics server 130 to retrieve data and analytics related to one or more assets 100 or to issue commands to one or more telematics device 200 via the telematics server 130. The administration terminal 140 is shown as a laptop computer, but may also be a desktop computer, a tablet (not shown), or a smartphone. The administration terminal 140 may run a web browser or a custom application which allows retrieving data and analytics, pertaining to one or more assets 100, from the telematics server 130 via a web interface of the telematics server 130. The administration terminal 140 may also be used to issue commands to one or more telematics device 200 via the telematics server 130. A fleet manager 20 may communicate with the telematics server 130 using the administration terminal 140. In addition to retrieving data and analytics, the administration terminal 140 allows the fleet manager 20 to set alerts and geofences for keeping track of the assets 100, receiving notifications of deliveries, and so on.

The operator terminals 150 are electronic devices, such as smartphones or tablets. The operator terminals 150 are used by operators 10 (for example, vehicle drivers) of the assets 100 to both track and configure the usage of the assets 100. For example, as shown in FIG. 1, the operator 10_1 has the operator terminal 150_1, the operator 10_2 has the operator terminal 150_2, and the operator 10_N has the operator terminal 150_N. Assuming the operators 10 all belong to a fleet of vehicles, each of the operators 10 may operate any of the assets 100. For example, FIG. 1 shows that the operator 10_1 is associated with the asset 100_1, the operator 10_2 is associated with the asset 100_2, and the operator 10_N is associated with the asset 100_N. However, any operator 10 may operate any asset 100 within a particular group of assets, such as a fleet. The operator terminals 150 are in communication with the telematics server 130 over the network 50. The operator terminals 150 may run at least one asset configuration application. The asset configuration application may be used by an operator 10 to inform the telematics server 130 that the asset 100 is being currently operated by the operator 10. For example, the operator 10_2 may use an asset configuration application on the operator terminal 150_2 to indicate that the operator 10_2 is currently using the asset 100_2. The telematics server 130 updates the telematics database 132 to indicate that the asset 100_2 is currently associated with the operator 10_2. Additionally, the asset configuration application may be used to report information related to the operation duration of the vehicle, the number of stops made by the operator during their working shift, and so on. Furthermore, the asset configuration application may allow the operator to configure the telematics device 200 coupled to the asset 100 that the operator 10 is operating.

In operation, a telematics device 200 is coupled to an asset 100 to capture asset data. The asset data may be combined with location data obtained by the telematics device 200 from a location module in communication with the satellites 170 and/or sensor data gathered from sensors in the telematics device 200 or another device coupled to the telematics device 200. The combined asset data, location data, and sensor data may be termed "telematics data." The telematics device 200 sends the telematics data, to the telematics server 130 over the network 50. The telematics server 130 may process, aggregate, and analyze the telematics data to generate asset information pertaining to the assets 100 or to a fleet of assets. The telematics server 130 may store the telematics data and/or the generated asset information in the telematics database 132. The administration terminal 140 may connect to the telematics server 130, over the network 50, to access the generated asset information. Alternatively, the telematics server 130 may push the generated asset information to the administration terminal 140. Additionally, the operators 10, using their operator terminals 150, may indicate to the telematics server 130 which assets 100 they are associated with. The telematics server 130 updates the telematics database 132 accordingly to associate the operator 10 with the asset 100. Furthermore, the telematics server 130 may provide additional analytics related to the operators 10 including work time, location, and operating parameters.

For example, for vehicle assets, the telematics data may include turning, speeding, and braking information. The telematics server 130 can correlate the telematics data to the vehicle's driver by querying the asset database 310. A fleet manager 20 may use the administration terminal 140 to set alerts for certain activities pertaining to the assets 100. When criteria for an alert is met, the telematics server 130 sends a message to the administration terminal 140 to notify a fleet manager 20, and may optionally send alerts to the operator terminal 150 to notify an operator 10 of the alert. For example, a vehicle driver operating the vehicle outside of a service area or hours of service may receive an alert on their operator terminal 150. A fleet manager 20 may also use the administration terminal 140 to configure a telematics device 200 by issuing commands thereto via the telematics server 130. Alerts may also be sent to the telematics device 200 to generate an alert to the driver such as a beep, a displayed message, or an audio message.

Telematics Device

Figure 2:
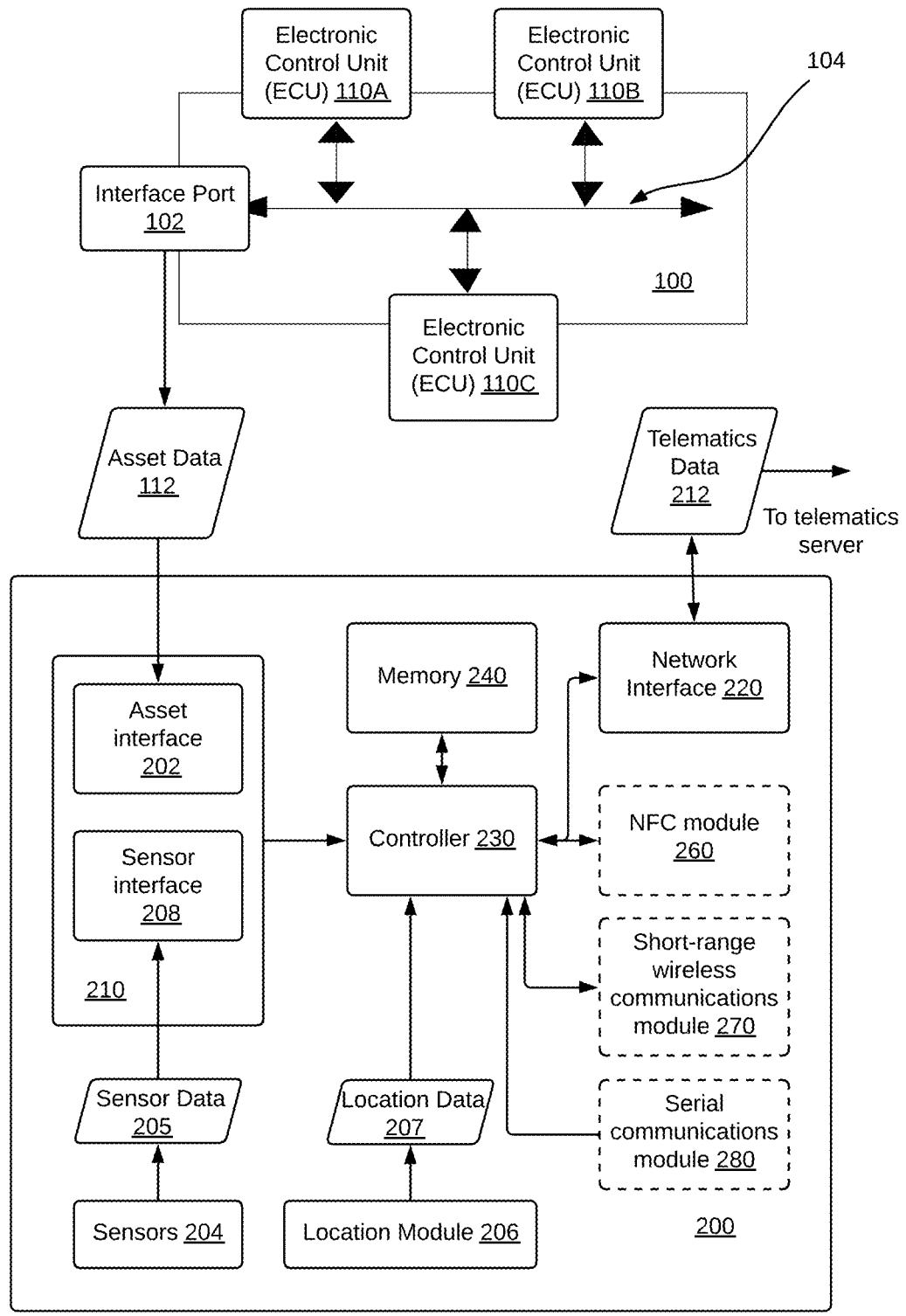
FIG. 2 is a block diagram showing a telematics device coupled to an asset.

Further details relating to the telematics device 200 and how it interfaces with an asset 100 are shown with reference to FIG. 2. FIG. 2 depicts an asset 100 and a telematics device 200 coupled thereto. Selected relevant components of each of the asset 100 and the telematics device 200 are shown.

The asset 100 may have a plurality of electronic control units (ECUs). An ECU is an electronic module which interfaces with one or more sensors for gathering information from the asset 100. For example, an engine coolant temperature (ECT) ECU may contain a temperature sensor and a controller for converting the measured temperature into digital data representative of the oil temperature. Similarly, a battery voltage ECU may contain a voltage sensor for measuring the voltage at the positive battery terminal and a controller for converting the measured voltage into digital data representative of the battery voltage. A vehicle may, for example, have around seventy ECUs. For simplicity, only a few of the ECUs 110 are depicted in FIG. 2. For example, in the depicted embodiment the asset 100 has three ECUs shown as the ECU 110A, the ECU 110B, and the ECU 110C ("the ECUs 110"). The ECU 110A, the ECU 110B, and the ECU 110C are shown to be interconnected via an asset communications bus. One example of an asset communications bus is a Controller Area Network (CAN) bus. For example, in FIG. 2 the ECUs 110 are interconnected using the CAN bus 104. The ECUs 110 send and receive information to one another in CAN data frames by placing the information on the CAN bus 104. When an ECU 110 places information on the CAN bus 104, other ECUs 110 receive the information and may or may not consume or use that information. Different protocols may be used to exchange information between the ECUs over a CAN bus. For example, ECUs 110 in trucks and heavy vehicles use the Society of Automotive Engineering (SAE) J1939 protocol to exchange information over a CAN bus 104. Most passenger vehicles use the SAE J1979 protocol, which is commonly known as On-Board Diagnostic (OBD) protocol to exchange information between ECUs 110 on their CAN bus 104. In industrial automation, ECUs use a CANOpen protocol to exchange information over a CAN bus 104. An asset 100 may allow access to information exchanged over the CAN bus 104 via an interface port 102. For example, if the asset 100 is a passenger car, then the interface port 102 is most likely an OBD-II port. Data accessible through the interface port 102 is termed the asset data 112. In some embodiments, the interface port 102 includes a power interface for providing electric power to a telematics device 200 connected thereto.

The telematics device 200 includes a controller 230 coupled to a memory 240, an interface layer 210 and a network interface 220. The telematics device 200 also includes one or more sensors 204 and a location module 206 coupled to the interface layer 210. The telematics device 200 may also contain some optional components, shown in dashed lines in FIG. 2. For example, the telematics device 200 may contain one or more of: a near-field communications (NFC) module such as NFC module 260, a short-range wireless communications module 270, and a wired communications module such as a serial communications module 280. In some embodiments (not shown), the telematics device 200 may have a dedicated power source or a battery. In other embodiments, the telematics device 200 may receive power directly from the asset 100, via the interface port 102. The telematics device 200 shown is an example. Some of the components shown in solid lines may also be optional and may be implemented in separate modules. For example, some telematics devices (not shown) may not have a location module 206 and may rely on an external location module for obtaining the location data 207. Some telematics devices may not have any sensors 204 and may rely on external sensors for obtaining sensor data 205.

The controller 230 may include one or any combination of a processor, microprocessor, microcontroller (MCU), central processing unit (CPU), processing core, state machine, logic gate array, application-specific integrated circuit (ASIC), field-programmable gate array (FPGA), or similar, capable of executing, whether by software, hardware, firmware, or a combination of such, the actions performed by the controller 230 as described herein. The controller 230 may have an internal memory for storing machine-executable programming instructions to conduct the methods described herein.

The memory 240 may include read-only-memory (ROM), random access memory (RAM), flash memory, magnetic storage, optical storage, and similar, or any combination thereof, for storing machine-executable programming instructions and data to support the functionality described herein. The memory 240 is coupled to the controller 230 thus enabling the controller 230 to execute the machine-executable programming instructions stored in the memory 240 and to access the data stored therein. The memory 240 may contain machine-executable programming instructions, which when executed by the controller 230, configures the telematics device 200 for receiving asset data 112 from the asset 100 via the asset interface 202, and for receiving sensor data 205 from the sensors 204 and/or location data 207 from the location module 206 via the sensor interface 208. The memory 240 may also contain machine-executable programming instructions for combining asset data 112, sensor data 205 and location data 207 into telematics data 212. Additionally, the memory 240 may further contain instructions which, when executed by the controller 230, configures the telematics device 200 to transmit the telematics data 212 via the network interface 220 to a telematics server 130 over a network 50. In some embodiments, the memory 240 only stores data, and the machine-executable programming instructions for conducting the aforementioned tasks are stored in an internal memory of the controller 230.

The location module 206 may be a global positioning system (GPS) transceiver or another type of location determination peripheral that may use, for example, wireless network information for location determination. The location module 206 is coupled to the controller 230 and provides location data 207 thereto. The location data 207 may be in the form of a latitude and longitude, for example.

The sensors 204 may be one or more of: a temperature sensor, a pressure sensor, an optical sensor, a motion sensor such as an accelerometer, a gyroscope, or any other suitable sensor indicating a condition pertaining to the asset 100 to which the telematics device 200 is coupled. The sensors provide sensor data 205 to the controller 230 via the sensor interface 208.

The interface layer 210 may include a sensor interface 208 and an asset interface 202. The sensor interface 208 is configured for receiving the sensor data 205 from the sensors 204. For example, the sensor interface 208 interfaces with the sensors 204 and receives the sensor data 205 therefrom. The asset interface 202 receives asset data 112 from the asset 100. In the depicted embodiment, the asset interface 202 is coupled to the interface port 102 of the asset 100. The asset data 112, received at the telematics device 200, from the asset 100 may be in the form of data messages, such as CAN data frames. The asset data 112 may describe one or more of any of: a property, a state, and an operating condition of the asset 100. For example, where the asset 100 is a vehicle, the data may describe the speed at which the vehicle is traveling, a state of the vehicle (off, idle, or running), or an engine operating condition (e.g., engine oil temperature, engine revolutions-per-minutes (RPM), or a battery voltage). In addition to receiving the asset data 112, in some embodiments the asset interface 202 may also receive power from the asset 100 via the interface port 102. The interface layer 210 is coupled to the controller 230 and provides both the asset data 112 and the sensor data 205 to the controller 230.

The network interface 220 may include a cellular modem, such as an LTE-M modem, CAT-M modem, other cellular modem, Wi-Fi modem, or any other communication device configured for communication via the network 50 with which to communicate with the telematics server 130. The network interface 220 may be used to transmit telematics data 212 obtained from the asset 100 to the telematics server 130 for a telematics service or other purposes. The network interface 220 may also be used to receive instructions from the telematics server 130 for configuring the telematics device 200 in a certain mode and/or requesting a particular type of the asset data 112 from the asset 100.

The NFC module 260 may be an NFC reader which can read information stored on an NFC tag. The NFC module 260 may be used to confirm the identity of the operator 10 by having the operator 10 tap an NFC tag onto the telematics device 200 such that the NFC tag is read by the NFC module 260. The information read from the NFC tag may be included in the telematics data 212 sent by the telematics device 200 to the telematics server 130.

The short-range wireless communications module 270 is a component intended for providing short-range wireless communication capability to the telematics device 200. The short-range wireless communications module 270 may be a Bluetooth™ wireless fidelity (Wi-Fi), Zigbee™, or any other short-range wireless communications module. The short-range wireless communications module 270 allows other devices to communicate with the telematics device 200 over a short-range wireless network.

The serial communications module 280 is an example of a wired communications module. The serial communications module 280 is an electronic peripheral for providing serial wired communications to the telematics device 200. For example, the serial communications module 280 may include a universal asynchronous receiver transmitter (UART) providing serial communications per the RS-232 protocol. Alternatively, the serial communications module 280 may be a serial peripheral interface (SPI) bus, or an inter-integrated circuit (I2C) bus. As another example, the serial communications module 280 may be a universal serial bus (USB) transceiver.

In operation, an ECU 110, such as the ECU 110A, the ECU 110B, or the ECU 110C communicates asset data over the CAN bus 104. The asset data exchanged, between the ECUs 110, over the CAN bus 104 are accessible via the interface port 102 and may be retrieved as the asset data 112 by the telematics device 200. The controller 230 of the telematics device 200 receives the asset data 112 via the asset interface 202. The controller 230 may also receive sensor data 205 from the sensors 204 over the sensor interface 208. Furthermore, the controller 230 may receive location data 207 from the location module 206. The controller 230 combines the asset data 112 with the sensor data 205 and the location data 207 to obtain the telematics data 212. The controller 230 transmits the telematics data 212 to the telematics server 130 over the network 50 via the network interface 220. Optionally, an operator 10 may tap an NFC tag to the NFC module 260 to identify themself as the operator 10 of the asset 100. Additionally, an external peripheral, such as a GPS receiver, may connect with the telematics device 200 via the short-range wireless communications module 270 or the serial communications module 280 for providing location information thereto. In some embodiments, the telematics device 200 may receive, via the network interface 220, commands from the telematics server 130. The received commands instruct the telematics device 200 to be configured in a particular way. For example, the received commands may configure the way in which the telematics device gathers asset data 112 from the asset 100 as will be described in further detail below.

The telematics data 212 which is composed of asset data 112 gathered from the asset 100 combined with the sensor data 205 and the location data 207 may be used to derive useful data and analytics, by the telematics server 130. However, there are times when additional data, which is not provided by the asset 100, the sensors 204 or the location module 206 may be needed. The telematics device 200 may have a limited number of sensors 204 such as accelerometers or gyroscopes providing limited information about the motion of the asset 100 on which the telematics device 200 is deployed. The location module 206 may provide location and direction information. However, in some cases, more information may be needed to derive useful data and analytics pertaining to the asset 100. One example of information that is not typically provided by the telematics device 200 is video capture data. Another example of information that is not typically provided by the telematics device 200 is any proprietary signaling provided by devices which does not follow any of the standard protocols (OBD-II, J1939 or CANOpen). Some equipment may not have a CAN bus and may provide proprietary digital and/or analog signals. Examples of such devices include industrial equipment, winter maintenance equipment such as salt spreaders, farming equipment, and the like. Additionally, the telematics device 200 may not have an NFC module 260 or a short-range wireless communications module 270 thus limiting its connectivity capabilities.

Input/Output Expander

Figure 3:
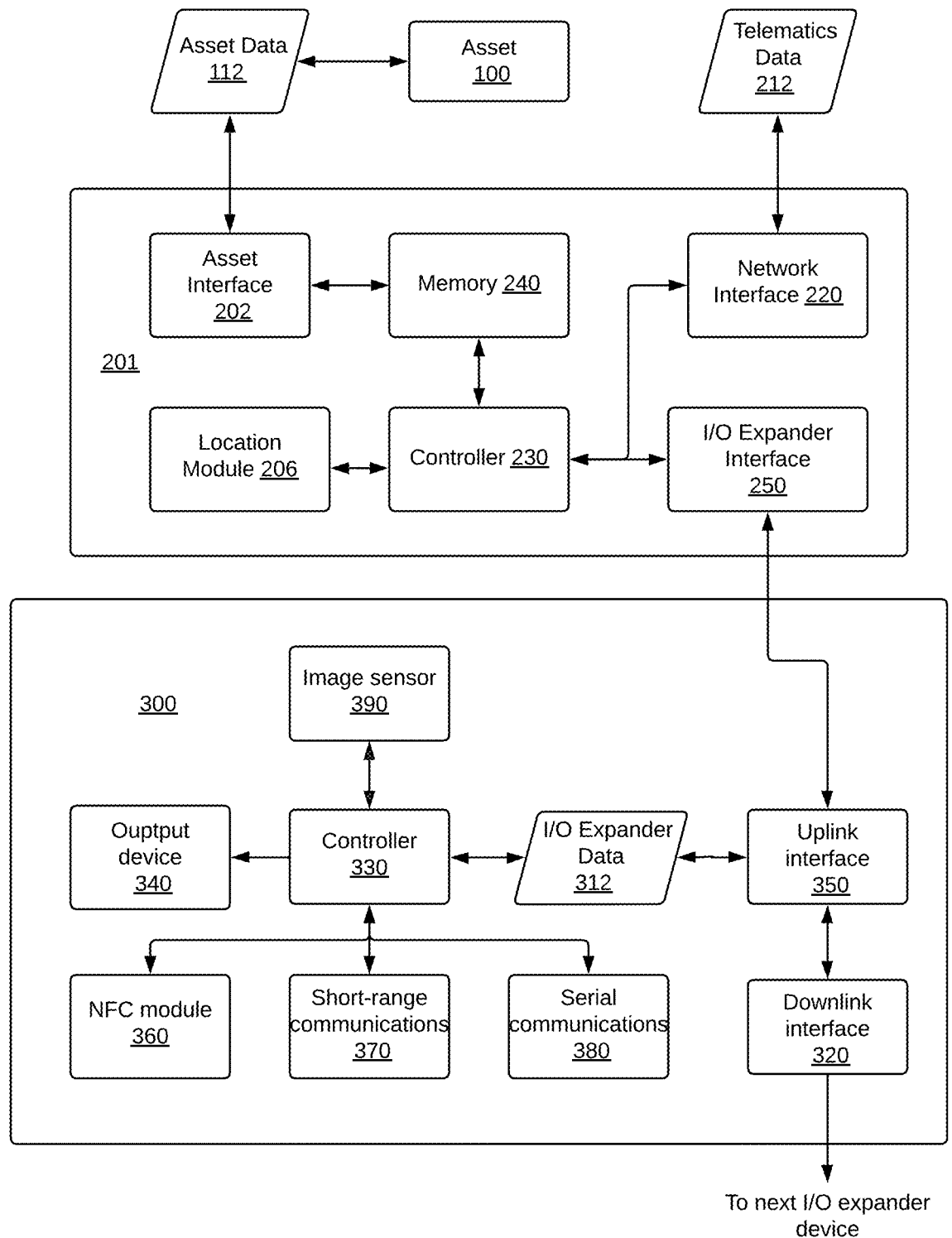
FIG. 3 is a block diagram showing a telematics device coupled to an asset and to an input/output (I/O) expander.

To capture and provide information or services not provided by the asset 100 or the telematics device, to produce an output, or to perform an action not supported by the telematics device, the telematics device 200 may be modified to allow an input/output expander device ("I/O expander") to connect thereto, as shown in FIG. 3. FIG. 3 shows a telematics device 201 coupled to an asset 100. An I/O expander 300 is coupled to the telematics device 201.

The asset 100 is similar to the asset 100 of FIG. 2 and therefore the internal components thereof are not shown in FIG. 3 for simplicity.

The telematics device 201 has a somewhat similar configuration as the telematics device 200 of FIG. 2, but some of the optional components have been removed. Furthermore, the telematics device 201 adds an I/O expander interface 250 for interfacing with the I/O expander 300. The I/O expander interface 250 is coupled to the controller 230 and may be configured for exchanging I/O expander data 312 with the I/O expander 300.

The I/O expander 300 of FIG. 3 is an example I/O expander which is designed to provide additional connectivity options to a telematics device 200, which has more limited features than the one shown in FIG. 2. For example, the telematics device 201 shown in FIG. 3 does not have an NFC module, a short-range wireless communications module, or a serial communications module. Instead, the telematics device 201 has an I/O expander interface 250.

The I/O expander 300 may be an input device configured to capture additional data such as video frames, audio frames, or proprietary signals and provide that data to the telematics device 201. Alternatively, or additionally, the I/O expander 300 may be configured as an output device and may include a display for displaying information and/or an audio output device for broadcasting messages pertaining to the asset 100.

An I/O expander 300, which connects with the telematics device 201, varies in complexity depending on the purpose thereof. FIG. 3 shows an I/O expander 300 containing several components which may or may not all be present in other I/O expanders. For example, the I/O expander 300 includes a controller 330, an NFC module 260, an output device 340, a short-range communications module 370, an image sensor 390, a serial communications module 380, an uplink interface 350 and a downlink interface 520.

The controller 330 may be similar to the controller 230 of FIG. 3. In some embodiments, the controller 330 is a microcontroller with versatile I/O capabilities. For example, the controller 330 may be a microcontroller which has a plurality of I/O ports such as general-purpose inputs and outputs (GPIOs), serial ports, analog inputs, and the like. In some embodiments, the controller 330 may have built-in persistent memory such as flash memory on which machine-executable programming instructions for conducting the functionality of the I/O expander 300 may be stored. In other embodiments, the controller 330 may be coupled to a persistent memory module (not shown) that contains the machine-executable programming instructions for conducting the functionality of the I/O expander 300. The controller 330 may also have built-in volatile memory, such as random-access memory (RAM) for storing data. Alternatively, the I/O expander 300 may be connected to an external volatile memory for storing data.

The output device 340 receives data from the controller 330 and performs an output function. For example, the output device 340 may include a display for displaying information received from the controller 330. As another example, the output device 340 may include a speech synthesizer and a speaker for displaying audible information received from the controller 330. As yet another example, the output device 340 may be an output interface to a hardware device. For example, the output device 340 may be a motor controller that interfaces to an electric motor.

The NFC module 360, short-range communications module 370, and the serial communications module 380 are similar to the NFC module 260, short-range wireless communications module 270, and the serial communications module 280 described above with reference to FIG. 2.

The image sensor 390 may be a digital still camera or a digital video camera capable of capturing images. For example, the image sensor 390 may be a road-facing dashboard camera for monitoring the road ahead. In other examples, the image sensor 390 may be a driver-facing dashboard camera for identifying the operator 10 and/or their condition.

The uplink interface 350 is an electronic peripheral interface coupled to the controller 330 and is used to provide data exchange and/or power capabilities to the I/O expander 300. The uplink interface 350 allows the I/O expander 300 to transmit and receive I/O expander data. The uplink interface 350 is configured to use the same protocol and signaling as the I/O expander interface 250 of the telematics device 201. Accordingly, the I/O expander 300 may exchange the I/O expander data with the telematics device 201. In some embodiments, the uplink interface 350 may also include power pins connected to corresponding power pins in the I/O expander interface 250, thus allowing the I/O expander 300 to be powered via the telematics device 201. In other embodiments (not shown), the I/O expander 300 may have its own power source instead of or in addition to the power provided by the telematics device 201 via the uplink interface 350.

The downlink interface 520 is an electronic peripheral interface coupled to the uplink interface 350. The downlink interface 520 is configured to interface with the uplink interface 350 of another I/O expander 300 (as will be described below). Allowing the uplink interface 350 to connect to the downlink interface 320 of another I/O expander allows the daisy chaining of I/O expanders.

Integrated Telematics Device

Figure 4:
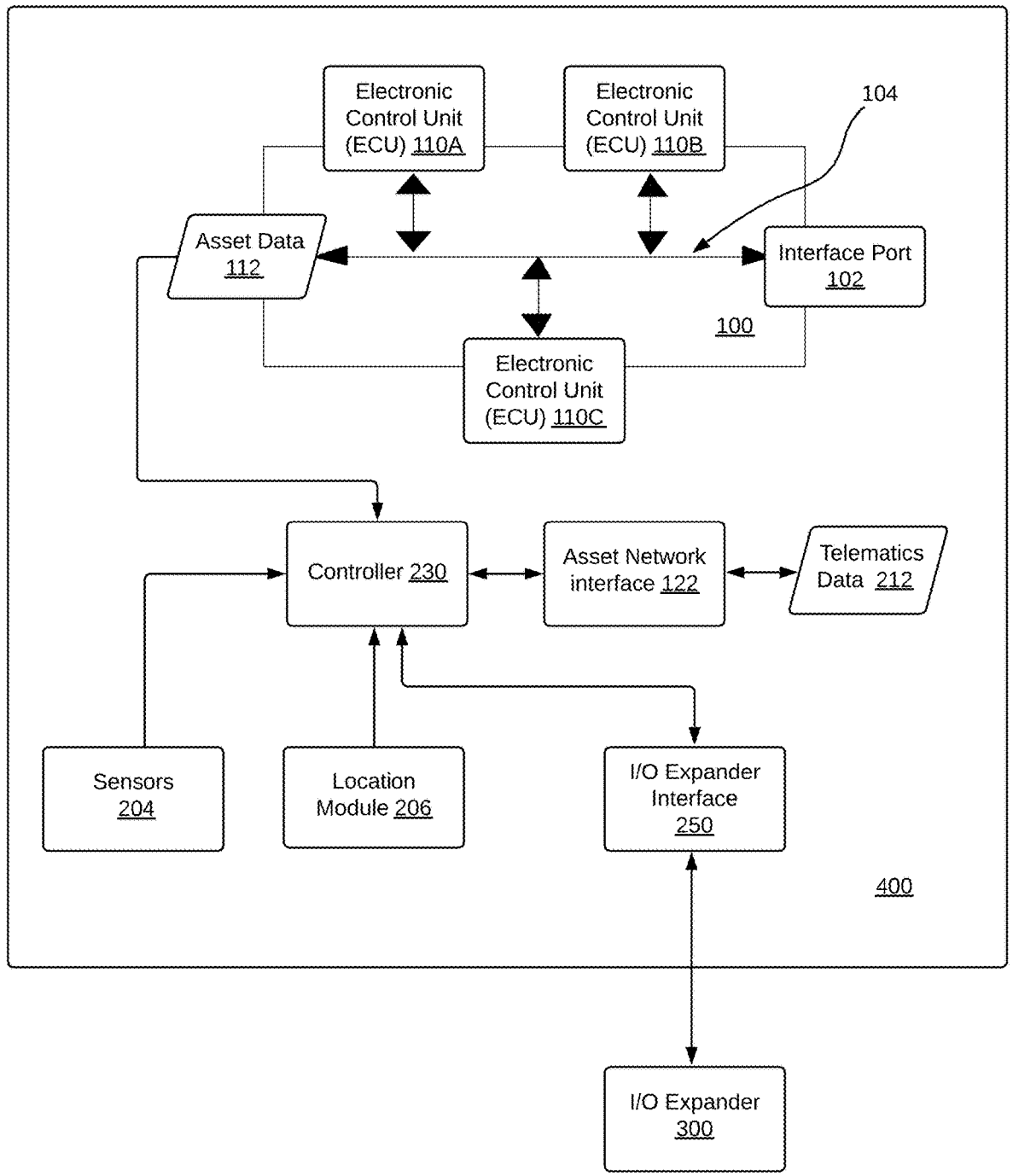
FIG. 4 is a block diagram showing an asset having a telematics device integrated therein and I/O expander coupled thereto.

In the above-mentioned figures, a telematics device is shown as a separate entity connected with a corresponding asset. The telematics device, however, may have its components integrated into the asset 100 at the time of manufacture of the asset 100. This may be the case when the asset 100 is a connected car having an asset network interface. For example, with reference to FIG. 4, there is shown an asset 400 with the components of a telematics device integrated therein, in accordance with embodiments of the present disclosure. The asset 400 is similar to the asset 100 but, being a connected asset such as a connected car, it has an asset network interface 122. In the depicted embodiment, the controller 230 is directly connected to the asset communications bus, which is a CAN bus 104 and may directly obtain the asset data 112 therefrom. The sensors 204 and the location module 206 are also integrated into the asset 100 and provide the sensor data 205 and the location data 207 to the controller 230 as described above. The asset network interface 122 belongs to the asset 400 and may be used by the asset 400 to communicate with an original equipment manufacturer (OEM) server, to a roadside assistance server, or for other purposes. The controller 230 may utilize the asset network interface 122 for the transmission of telematics data 212 provided by the controller 230. In order to support further not provided by the integrated peripherals such as the sensors 204 and the location module 206, the asset has an I/O expander interface 250 coupled to the controller 230 so that an I/O expander 300 may be connected to the asset 400 therethrough. The asset 400 may have an interface port 102 for connecting other devices other than a telematics device 200, such as a diagnostic tool including, but not limited to, an OBD-II reader device.

Rules for Vehicles or Groups

Figure 5A:
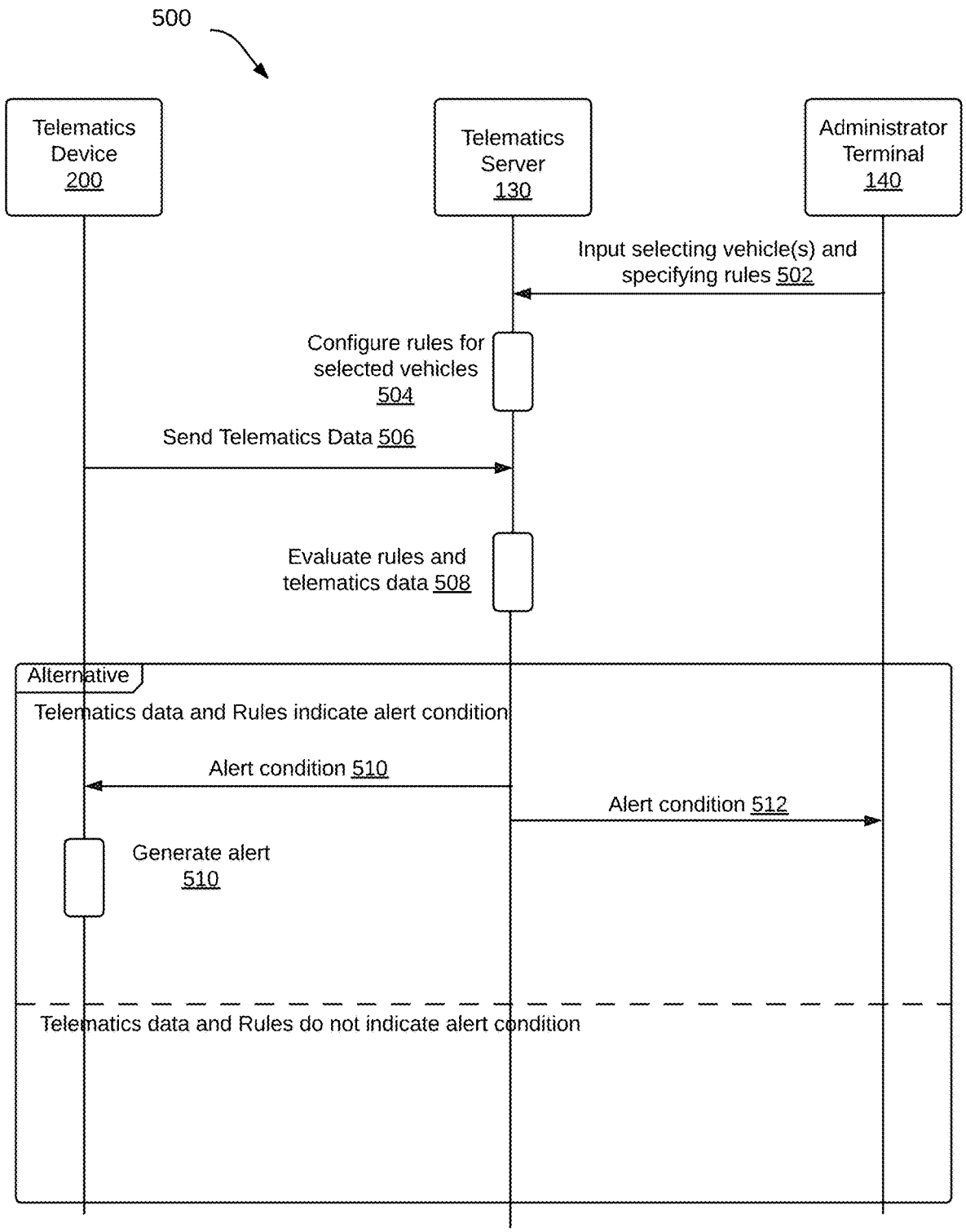
FIG. 5A is a message sequence diagram showing server-side rules configuration and alert generation in a telematics system, in accordance with embodiments of the present disclosure.

As discussed briefly above, the telematics server 130 maintains a plurality of rules that trigger actions or alerts based on the received telematics data 212. The rules may be configured by a fleet manager 20 for example, using an administration terminal 140. The telematics server 130 may, in response to receiving the telematics data 212, send an alert condition to a telematics device to trigger an action thereon. Additionally, the telematics server 130 may send the alert condition to the administration terminal 140. As an example, FIG. 5A is a message sequence diagram depicting a method 500 of generating an alert condition based on rules and telematics data 212, in accordance with embodiments of the present disclosure.

The method 500 starts at step 502. At step 502, a fleet manager 20 may use an administration terminal 140 to connect to the telematics server 130 and configure some rules for a vehicle or a group of vehicles. Details of the user interface and the options for configuring the rules will be described below. The administration terminal 140 may connect to the telematics server 130 by means of a web browser or a mobile application, for example.

At step 504, the telematics server 130 configures a plurality of rules for one or more vehicles selected in the input received from the administration terminal 140 in step 502. The telematics server 130 may store the rules in the telematics database 132 or internally within the telematics server 130.

At step 506, the telematics device 200 sends telematics data 212 to the telematics server 130. The telematics server 130 receives the telematics data 212 and may store the telematics data 212 in the telematics database 132 or in an internal storage.

At step 508, the telematics server 130 evaluates the telematics data 212 in light of the rules. The evaluation of telematics data 212 in light of the rules may generate an alert condition. For example, the telematics data 212 may indicate excessive speed, harsh braking, hard cornering, or a mechanical failure with the vehicle to which the telematics device 200 is coupled. Alternatively, the telematics server 130 may determine that the location of the telematics device 200 is within a geographic zone and that one of the rules stipulates that an alert must be generated. If the evaluation of the telematics data 212 and the rules indicate an alert condition, then at step 510, the telematics server 130 sends a message indicating an alert condition to the telematics device 200. An alert sent to the telematics device 200 may be used to trigger an alert indication on the telematics device 200. An alert indication on the telematics device 200 may be a beep, a flashing of an LED (light emitting diode), a message displayed on a display such as an LCD (liquid crystal display), or a voice message played over an audio device. In addition to sending an alert to the telematics device 200, the telematics server 130, in response to evaluating the telematics data 212 in light of the rules, may also send a message indicating an alert condition to the administrator terminal 140 as shown in step 512. For example, a fleet manager 20 may be interested in receiving an alert when a vehicle in the fleet is driving over the speed limit.

Figure 5B:
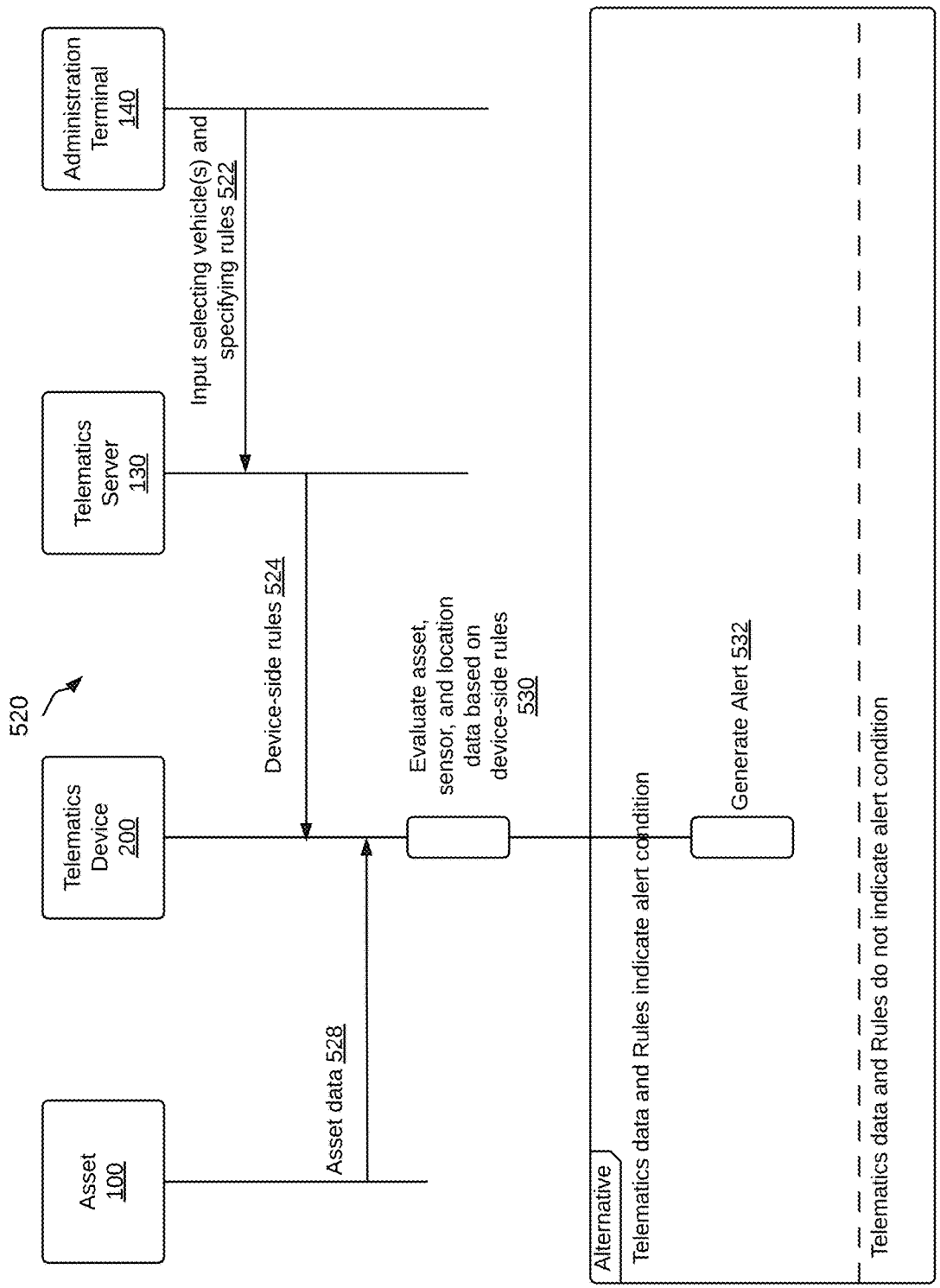
FIG. 5B is a message sequence diagram showing device-side rules configuration and alert generation, in accordance with embodiments of the present disclosure.

In some cases, the telematics device 200 may evaluate the asset data 112, sensor data 205, and location data 207 and determine whether an alert condition has been satisfied. This is described with reference to FIG. 5B.

Step 522 is similar to step 502 of FIG. 5A. An input on an administration terminal 140 specifies telematics device-side rules for one or more vehicles. In this case the device-side rules are rules which the telematics server 130 is to relay to the telematics device 200 corresponding to the selected vehicles specified in the input provided at the administration terminal 140.

At step 524, the telematics server 130 sends the device-side rules to the telematics device 200. The telematics device 200 receives the device-side rules.

At step 528, the asset 100 sends asset data 112 to the telematics device 200. The telematics device 200 receives the asset data 112.

At step 530, the telematics device 200 evaluates the asset data 112, and one of the sensor data 205 and the location data 207 based on the device-side rules. Some rules may be based only on the asset data 112. For example, a trouble code provided in the asset data 112 and indicating failure of an engine component may be sufficient to raise an alert condition. In other cases, the location data 207 may give an indication of the vehicle being in a particular zone that should trigger an alert condition. In further cases, the sensor data 205 may provide an indication of harsh braking or cornering based on accelerometer readings. Accordingly, the telematics device 200 may determine an alert condition based on some or all of the components of the telematics data 212.

If the telematics data 212 indicate an alert condition, then at step 532, the telematics device 200 generates an alert.

Examples of the rules that may be set by the fleet manager 20 on the telematics server 130 via the administration terminal 140 will be described with reference to FIGS. 6 through 9. FIGS. 6 through 9 depict user interfaces which may be displayed on the display of the administration terminal 140 for configuring the rules on the telematics server 13.

Figure 6:
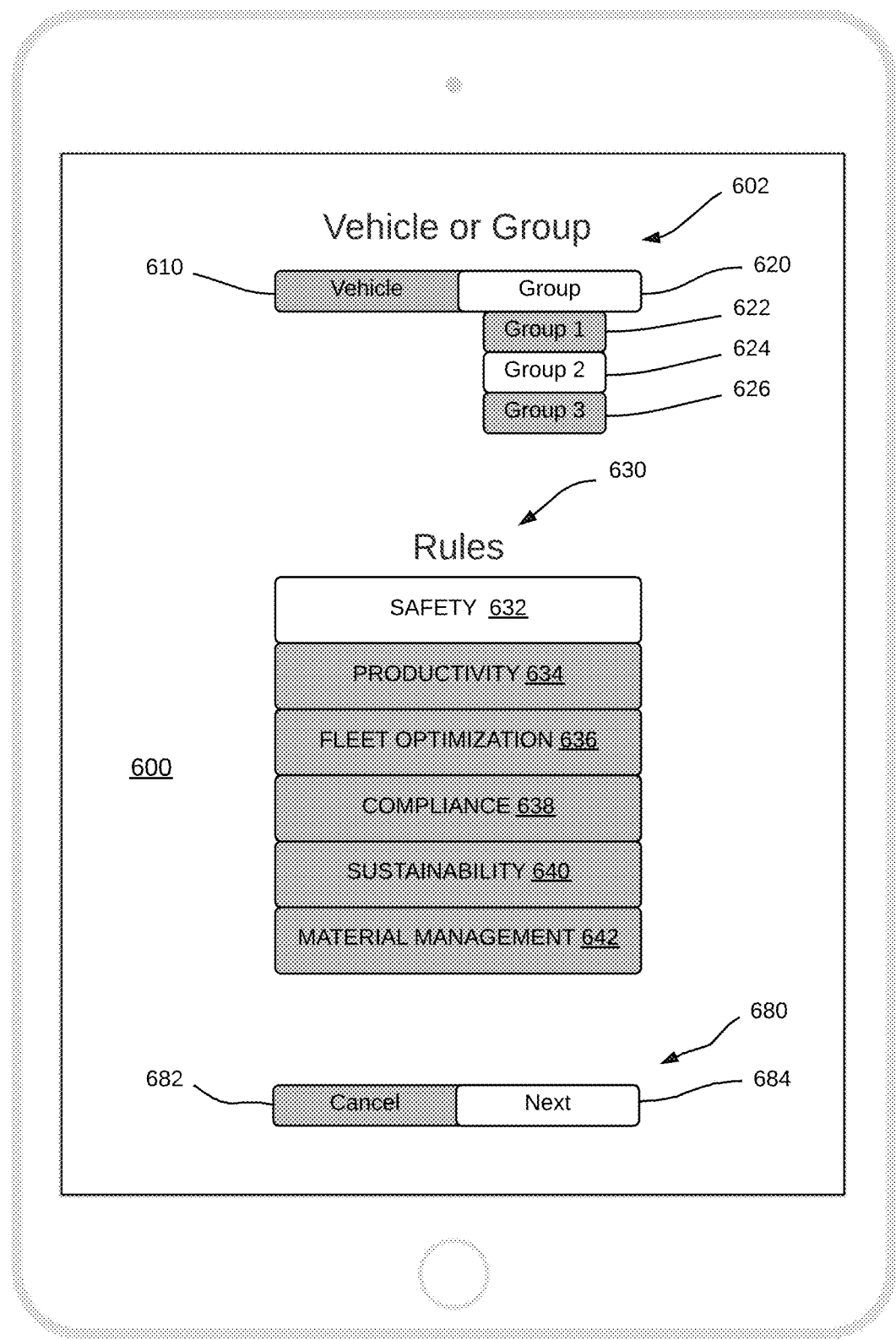
FIG. 6 is a user interface for selecting a vehicle or a group, and selecting a category of rules, in accordance with embodiments of the present disclosure.

FIG. 6 depicts a rules category selection user interface 600 which allows selecting a vehicle or a group of vehicles, and selecting a category of rules to configure for the selected vehicle or group of vehicles. The rules category selection user interface comprises a vehicle or group selection user interface control 602, a rules category selection user interface control 630, and a flow user interface control 680.

The vehicle or group selection user interface control 602 includes a vehicle selector 610 and a group selector 620. In the depicted embodiment, the group selector 620 is showing three groups given generic names such as "Group 1" labeled as the user interface element 622, "Group 2" labeled as the user interface element 624, and "Group 3" labeled as the user interface element 626.

The rules category selection user interface control 630 includes user interface elements for selecting rule categories. In the depicted embodiment, the rules category selection user interface control 630 comprises a safety user interface element 632, a productivity user interface element 634, a fleet optimization user interface element 636, a compliance user interface element 638, a sustainability user interface element 640, and a material management user interface element 642. A user interface element may be selected by touching or clicking. A selected user interface element is highlighted.

The flow user interface control 680 controls the flow of the rule configuration process. The flow user interface control 680 comprises a next user interface element 684 and a cancel user interface element 682. Activating the cancel user interface element 682 abandons the rules configuration process. Activating the next user interface element 684 proceeds with the next step of the rule configuration process.

In operation the user selects either a vehicle or a group of vehicles. To select a vehicle the vehicle selector 610 is activated and a list of vehicles are displayed (not shown). To select a group of vehicles the group selector 620 is activated and a group is selected from the list of group user interface elements. In the depicted embodiment, the group named "Group 2" corresponding to the group user interface element 624 is being selected. To select a rules category, a user interface element from the rules category selection user interface control 630 is selected. In the depicted embodiment, the safety user interface element 632 is selected.

Once the vehicle or group, and the rule category are selected, the next user interface element 684 may be activated. In response to activating the next user interface element 684, the telematics server 130 determines the selected rule category and displays a corresponding user interface for selecting a rule from the selected rule category. In the depicted embodiment, the safety category is selected as depicted by highlighting the safety user interface element 632. Accordingly, in response to activating the next user interface element 684, a safety rule selection user interface 700 is displayed, as shown in FIG. 7.

Figure 7:
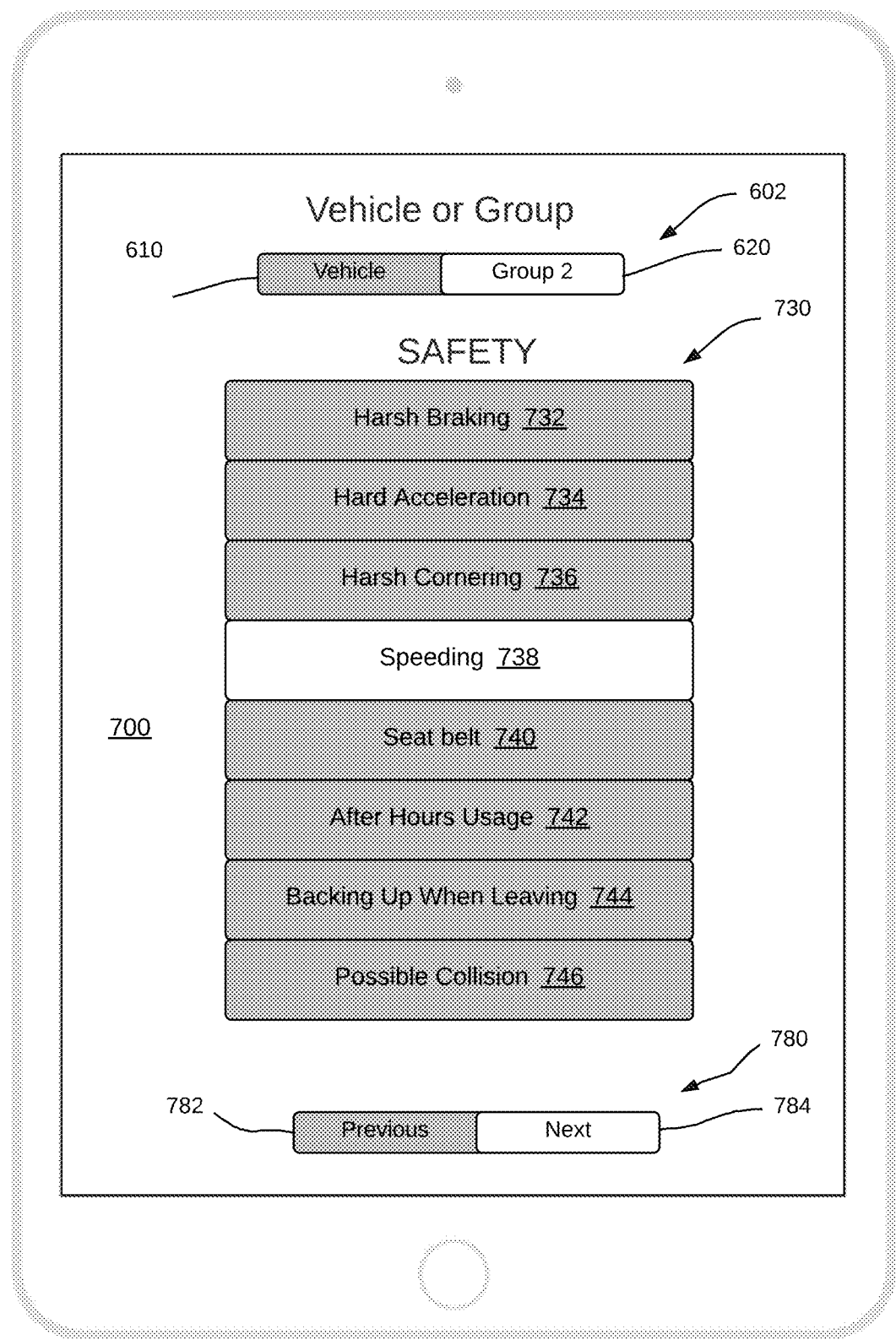
FIG. 7 is a user interface for selecting a safety rule for a selected vehicle or group, in accordance with embodiments of the present disclosure.

FIG. 7 depicts a safety rule selection user interface 700 for selecting a safety rule to configure for a vehicle or group of vehicles. The safety rule selection user interface 700 comprises the vehicle selector 610 and group selector 620 described above, a safety rule selection user interface control 730, and a flow user interface control 780.

The vehicle or group selection user interface control 602 shows the selections made in the previous user interface, i.e., that "Group 2" has been selected.

The safety rule selection user interface control 730 comprises a plurality of user interface elements each corresponding to a safety rule. In the depicted embodiment, the safety rule selection user interface control 730 includes a harsh braking user interface element 732, a hard acceleration user interface element 734, a harsh cornering user interface element 736, a speeding user interface element 738, a seat belt user interface element 740, an after hours usage user interface element 742, a backing up when leaving user interface element 744, and a possible collision user interface element 746.

The flow user interface control 780 controls the flow of the rule configuration process. The flow user interface control 780 comprises a next user interface element 784 and a previous user interface element 782. Activating the user interface element 682 abandons a safety rule selection user interface 700 and displays the rules category selection user interface 600. Activating the next user interface element 684 proceeds with the next step of the rule configuration process.

In operation, the user activates a safety rule by activating the corresponding safety rule user interface element. In the depicted embodiment, the speeding user interface element 738 has been activated and is highlighted indicating that the corresponding speeding rule has been selected for configuration. In response to activating the next user interface element 784, the speeding rule configuration user interface 800 is displayed as shown in FIG. 8.

Figure 8:
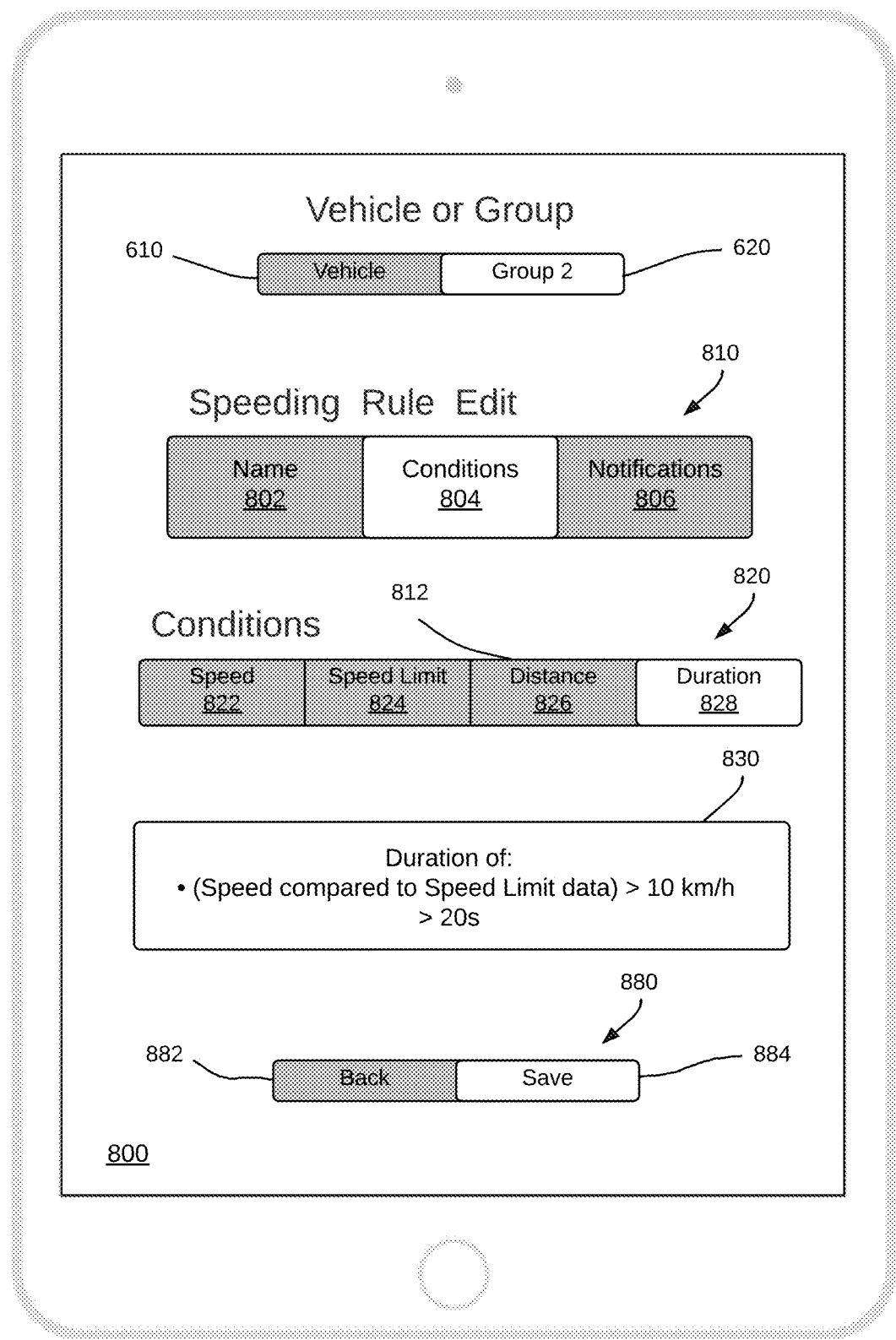
FIG. 8 is a user interface for editing the conditions of a speeding rule, in accordance with embodiments of the present disclosure.

FIG. 8 depicts a speeding rule configuration user interface 800 for editing the speeding rule. The speeding rule configuration user interface 800 includes a vehicle or group selection user interface control 602, and a speeding rule edit user interface control 810. In the depicted embodiment of FIG. 8, the speeding rule edit user interface control 810 is configured to allow the rule conditions to be configured. Accordingly, a conditions configuration user interface 820 is shown. The speeding rule configuration user interface 800 also comprises a flow user interface control 880.

The vehicle or group selection user interface control 602 shows the selections made in the previous user interface, i.e., that "Group 2" has been selected.

The speeding rule edit user interface control 810 allows selecting a category of parameters to edit, such as the name, the conditions, and the notifications. Accordingly, the speeding rule edit user interface control contains a name user interface element 802, a conditions user interface element 804, and a notifications user interface element 806. The name user interface element 802 can be activated to display a user interface control (not shown) for entering a name for the speeding rule. The conditions user interface element 804 can be activated to display a conditions configuration user interface 820 as shown in FIG. 8 and the notifications user interface element 806 can be activated to display a notifications configuration user interface 902 as will be described below with reference to FIG. 9.

In the depicted embodiment of FIG. 8 the conditions user interface element 804 is selected and accordingly the conditions configuration user interface 820 is shown. The conditions configuration user interface 820 consists of condition user interface control 812 and a conditions text field 830. The condition user interface control 812 has a plurality of condition user interface elements for specifying a condition based on speed, speed limit, distance, and duration. The condition user interface elements are used to form a condition for the rule in the conditions text field 830.

The speed user interface element 822, when activated specifies a rule that is based on the absolute speed of the vehicle. For example, the speed user interface element may specify a condition that is satisfied when the vehicle speed is at 110 km/h regardless of the speed limit of the road being traveled on.

The speed limit user interface element 824, when activated, specifies a rule that is based on the current speed limit of the street that the vehicle is currently traveling on. For example, as shown in the conditions text field, part of the rule specifies a condition that the vehicle's current speed is 10 Km/h higher than the current speed limit.

The distance user interface element 826, when activated, specifies the distance that the vehicle has to travel for while meeting the speeding condition before an alert is generated. The distance user interface element 826 is used to modify an existing rule that uses either the speed or the speed limit.

The duration user interface element 828, when activated, specifies the time duration that the vehicle has to travel while meeting the speeding condition before an alert is generated. The duration user interface element 828 is used to modify an existing rule that uses either the speed or the speed limit.

The conditions text field 830 specifies the conditions that need to be met to trigger the current speeding rule. The currently depicted speeding conditions text field shows a rule that is triggered by the vehicle traveling over the speed limit by 10 Km/h for a duration that is more than 20 seconds.

When the conditions specified for a particular rule are satisfied, a notification can be triggered. To specify the notification settings, a notifications user interface element is activated. In response to the activation of a notifications user interface element, a notification configuration user interface element is displayed. For example, in the depicted embodiment, activating the notifications user interface element 806 causes the conditions configuration user interface 820 to be replaced with the notifications configuration user interface 902, as shown in FIG. 9.

The flow user interface control 880 controls the flow of the rule configuration process. The flow user interface control 880 comprises a save user interface element 884 and a previous user interface element 882. Activating the previous user interface element 882 cancels the speeding rule configuration and displays the safety rules selection user interface 700. Activating the save user interface element 884 saves the current rule configuration.

Figure 9:
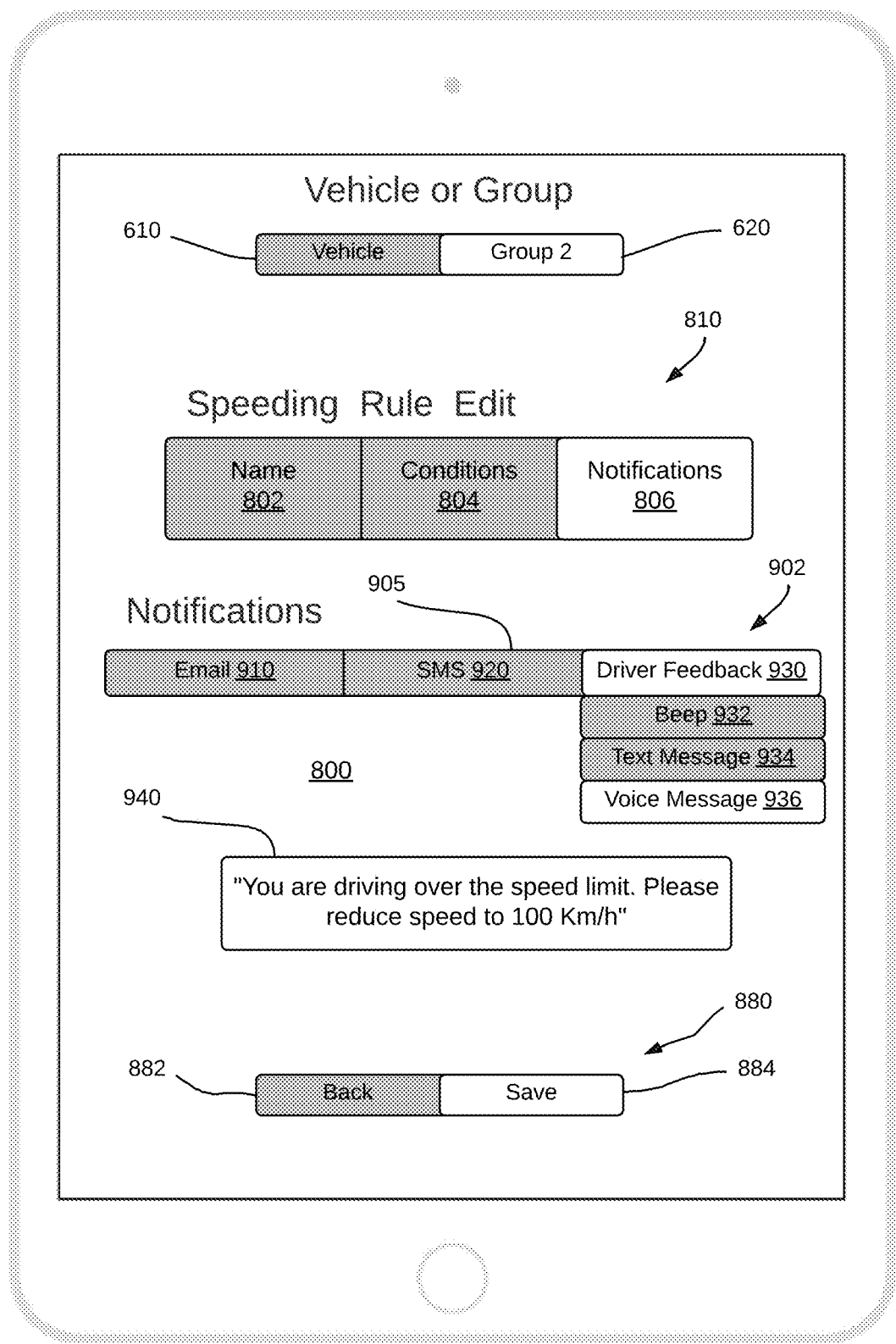
FIG. 9 is a user interface for selecting notification options for the speeding rule of FIG. 8, in accordance with embodiments of the present disclosure.

FIG. 9 shows the speeding rule configuration user interface 800 described above, with the exception that the conditions user interface 820 has been replaced with the notifications configuration user interface 902.

The notifications configuration user interface 902 consists of a notification type user interface control 905, and a notification text field 940.

The notification type user interface control 905 includes an email notification user interface control 910, a Short Messaging Service (SMS) notification user interface control 920, and a driver feedback user interface control 930. The email notification user interface control 910, when activated, allows specifying an email address to which an email is sent if the condition for the rule specified in the conditions text field 830 is satisfied. Similarly, the SMS notification user interface control 920, when activated, allows specifying a mobile telephone number to which an SMS message is sent if the condition for the rule specified in the conditions text field 830 is satisfied.

The driver feedback user interface control 930 allows specifying a notification local to the telematics device. The driver feedback may be in the form of a beep, a text message displayed on a display, or a voice message played by an audio device containing a speaker. Accordingly, activating the driver feedback user interface control 930 displays a plurality of user interface elements namely the beep user interface element 932, the text message user interface element 934, and the voice message user interface element 936.

The notification text field 940 contains the notifications message which may be sent over email, SMS, or used in the driver feedback.

In the depicted embodiment, the voice message user interface element 936 is highlighted indicating that a voice message is being configured. In this case, the notification text field 940 contains the alert message "You are driving over the speed limit. Please reduce speed to 100 Km/h", which is to be played over an audio device coupled to the telematics device, as will be described below.

With reference to FIGS. 6 through 9, a fleet manager 20 using an administration terminal may configure a voice message to be played whenever a vehicle is driven 10 Km/h over the speed limit for 20 seconds, for example. Using the rules category selection user interface 600, the vehicle or group are selected using the vehicle or group selection user interface control 602. The speeding rule is under the safety user interface element 632 in the rules category selection user interface control 630. In response to selecting the safety user interface element 632, the safety rule selection user interface 700 is displayed. The speeding user interface element 738 is selected from the safety rule selection user interface control 730. In response to selecting the speeding user interface element 738, the speeding rule configuration user interface 800 is displayed. The speeding rule interface 800 has the conditions user interface element 804 selected and therefore the conditions configuration user interface 820 displayed. The conditions of a speeding rule are entered in the conditions text field 830. Different elements may be entered using the conditions user interface controls such as the speed user interface element 822, the speed limit user interface element 824, the distance user interface element 826, and the duration user interface element 828. For example, the current speed of the vehicle is entered in the conditions text field 830 by clicking the speed user interface element 822, which is in the form of a button. The user may type some text such as "compared to" or it may be entered automatically after the current speed is entered. In response to activating the speed limit user interface element 824, the speed limit is added to the conditions text field 830. The offset 10 Km/h over the speed limit may be entered manually. To specify a duration for the condition to be satisfied, the duration user interface element 828 may be activated (i.e., touched or clicked).

To specify the notification that is to be generated when the speeding rule is triggered, the notifications user interface element 806 may be activated. In response to activating the notifications user interface element 806, the notifications configuration user interface 902 is displayed. In response to activating the driver feedback user interface control 930, a number of options are displayed such as a beep user interface element 932, a text message user interface element 934, and a voice message user interface element 936. To select a voice message that is to be played over a speaker of an audio device, the voice message user interface element 936 is selected. In response to selecting the voice message user interface element 936, a notification text field 940 is displayed in which a text message may be entered. When the vehicle to which the telematics device 200 is coupled detects speeding of 10 Km/h or more over the speed limit for a duration of over 20 seconds, the message "you are driving over the speed limit. Please reduce speed to 100 Km/h".

Audio Output Expander

Figure 10:
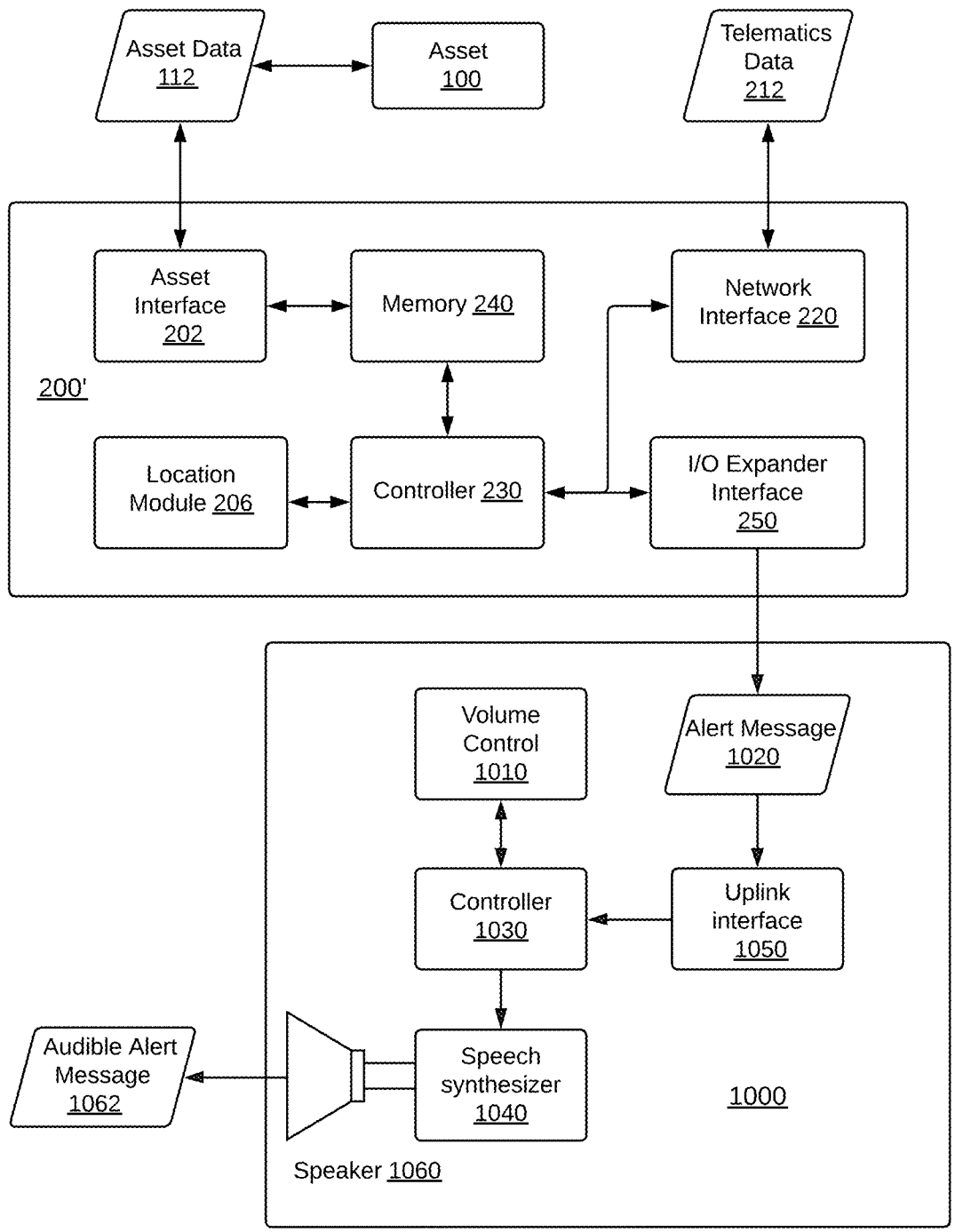
FIG. 10 is a block diagram showing an asset tracking device coupled to an asset and to an audio output expander having volume control.

Playing an audio alert message in response to triggering a rule requires an output device that can play audio alert messages. FIG. 10 depicts a telematics device 201 coupled to an I/O expander in the form of an audio output expander 1000, in accordance with embodiments of the present disclosure. The telematics device 201 has been described above with reference to FIG. 3. The audio output device 1000 has a controller 1030, an uplink interface 1050, a speech synthesizer 1040, a speaker 1060, and a volume control module 1010.

The controller 1030 and the uplink interface 1050 are similar to the controller 330 and the uplink interface 350 of FIG. 3, respectively. The speech synthesizer 1040 is an electronic hardware device that converts text to speech thus generating an audible message from a text message provided thereto. In some embodiments, the speech synthesizer 1040 is implemented in firmware that is executed by the controller 1030 from an internal memory thereof. The speech synthesizer 1040 may include an amplifier for amplifying the audible message generated by the speech synthesizer. The speaker 1060 is an audio loudspeaker coupled to the speech synthesizer 1040 and configured to play out audio messages generated by the speech synthesizer 1040. The volume control module 1010 is a hardware module that provides a signal indicative of the desired volume. For example, the volume control module 1010 may include an attenuator or a potentiometer coupled to a rotary or slider control for providing a variable analog signal to the controller 1030. The controller 1030 may comprise an analog to digital converter (ADC) for converting the analog signal into a digital value.

In operation, the telematics device 201 may determine that an alert message 1020 needs to be played over the audio output expander 1000. The alert message 1020 may need to be played in response to triggering a rule wherein the notification has been configured to generate a voice message as discussed above. The controller 230 of the telematics device 201 may send the alert message 1020 over the I/O expander interface 250 to the audio output expander 1000. The controller 1030 receives the alert message 1020 and sends it to the speech synthesizer 1040. The alert message 1020 may be in the form of text, similar to the text message in the notification text field 940 of FIG. 9. The speech synthesizer 1040 generates an audible alert message 1062 and plays it on the speaker 1060 coupled thereto. The audible alert message 1062 may or may not be heard by the operator 10 of the vehicle depending on the ambient noise. Accordingly, the operator 10 may choose to increase the volume using the volume control module 1010 if the vehicle has loud engine noise or is being operated in a noisy environment such as a construction site. Adjusting the volume control module 1010 changes the analog signal provided to the controller 1030. The controller 1030 may use an ADC to convert the analog signal to a digital value indicating the desired volume. The controller 1030 may adjust the volume of the speech synthesizer 1040 based on the digital value that indicates the desired volume.

In other embodiments (not shown), the volume control module 1010 is directly coupled to the speech synthesizer 1040 and controls the audio output level (i.e., volume) thereof.

In some cases, an operator 10 wishing not to hear any audible alert messages 1062 may turn down the volume of the audio produced by the speaker 1060 by adjusting the volume control module 1010 to the lowest possible setting thereof. A fleet manager 20 may not appreciate the operator 10 disabling or lowering the volume of the audible alert messages as it may prevent the operator 10 from recognizing certain unacceptable practices and thus prevents them from correcting them. As such an audio output expander 1100 without a volume control module 1010 may be desirable in order to force an operator 10 to always hear the audible alert messages. However, removing the volume control module 1010 poses a problem regarding the volume or audio output level of the speaker 1060. An audio output level that is set too high may be irritating to the operator 10 and is unnecessary when the vehicle is being operated in a quiet environment. Conversely, an audio output level which is set too low may not be audible in a noisy environment. Accordingly, an audio output expander needs to employ automatic volume control (AVC) and adjust the audio output level (volume) based on ambient noise. An audio output expander 1100 that employs automatic volume control is shown in FIG. 11.

Figure 11:
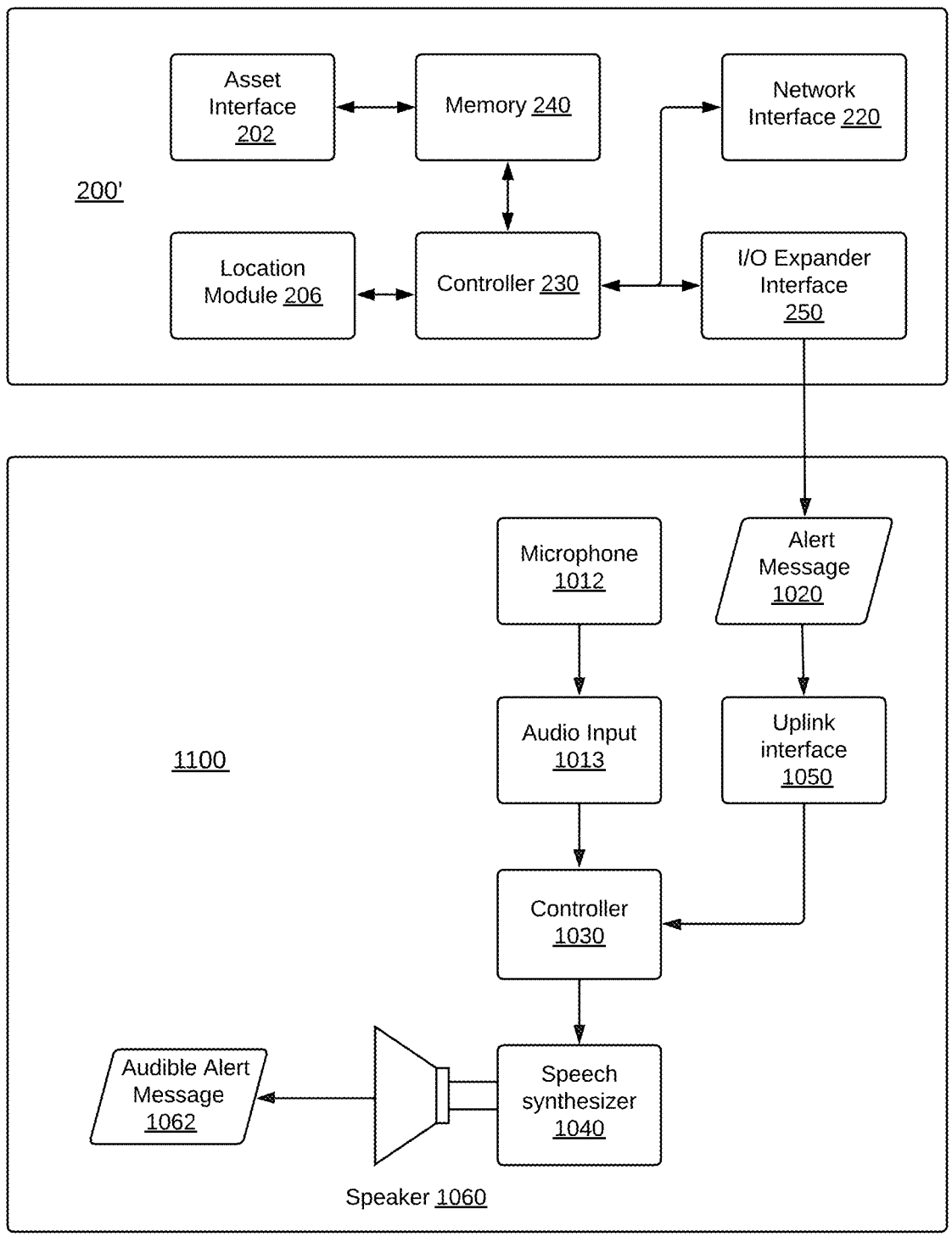
FIG. 11 is a block diagram showing an asset tracking device coupled to an asset and to an audio output expander having automatic volume control capability, in accordance with an embodiment of the present disclosure.

FIG. 11 depicts a telematics device 201 and an audio output expander 1100 coupled thereto. The audio output expander 1100 has similar components to the audio output expander 1000 except that it features some audio components for automatic volume control. Specifically the telematics device 201 includes a microphone 1012 and an audio input module 1013 instead of the volume control module 1010. The microphone 1012 is used to capture ambient noise. The audio input module 1013 converts the signal provided by the microphone into a signal that may be processed by the controller 1030. For example, the audio input module 1013 may comprise an analog to digital converter (ADC) and a digital signal processor (DSP). In operation the microphone 1012 captures ambient noise and provides an audio signal to the audio input module 1013. The audio input module 1013 provides a digital signal indicative of the ambient noise to the controller 1030. Based on the digital signal indicative of the ambient noise, the controller 1030 may adjust the volume of the speech synthesizer 1040 to a higher level so that the audible messages output by the speaker 1060 are audible over the ambient noise. Conversely, when the ambient noise is low, the controller 1030 may adjust the audio output level of the speech synthesizer to a lower level so that the audible output message by the speaker 1060 is not too loud.

While the audio output expander 1100 of FIG. 11 may address the issue of the ambient noise, it relies on having the microphone 1012 being on all the time and the controller 1030 constantly processing the audio captured by the microphone 1012. Having the microphone 1012 capturing audio at all times may raise some privacy concerns and also consumes electric power unnecessarily. Accordingly, the inventor has produced a scheme wherein the microphone 1012 and the automatic volume control mechanism are only enabled with each alert message 1020. This is explained further with reference to FIG. 12.

Figure 12:
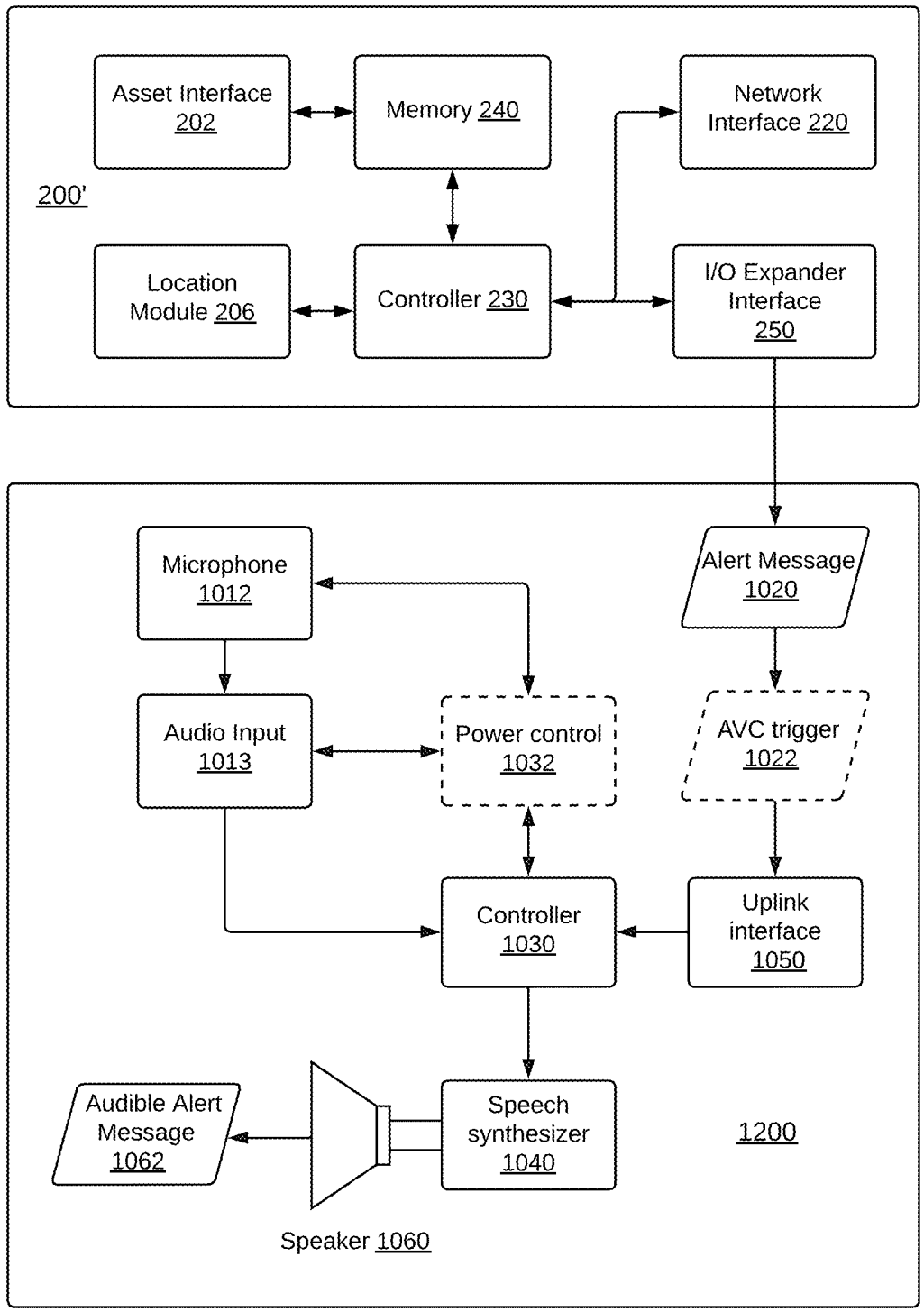
FIG. 12 is a block diagram showing an asset tracking device coupled to an asset and to an audio output expander having automatic volume control capability, in accordance with another embodiment of the present disclosure.

FIG. 12 depicts a telematics device 201 coupled to an audio output expander 1200. The audio output expander 1200 has a similar structure as the audio output expander 1100 but has a power control module 1032 coupled to the controller 1030, the microphone 1012, and the audio input module 1013. The power control module 1032 may power the microphone 1012 and the audio input module 1013 up or down based on control signals from the controller 1030. The power control module 1032 is shown as a separate component in dashed lines to indicate that the functionality thereof may be integrated into the controller 1030 in which case the power control module 1032 may not be present.

In operation, the telematics device 201 determines that the audio output expander 1200 needs to generate an alert audio message. This may be due to an alert condition determined by the telematics device 201 or determined by the telematics server 130 and sent to the telematics device 201. In some embodiments, the controller 1030 receives an alert message 1020 while the microphone 1012 and the audio input module 1013 are powered off. In response to receiving the alert message, the controller 1030 sends control signals to the power control module 1032 instructing the power control module 1032 to power up the microphone 1012 and the audio input module 1013. In some embodiments, the power control module 1032 reports back to the controller 1030 with a confirmation that the microphone 1012 and the audio input module 1013 are fully powered up. In response to receiving the confirmation that the microphone 1012 and the audio input module 1013 are powered up, the controller 1030 invokes an automatic volume control procedure to detect the ambient noise and adjust the audio output level of the speech synthesizer 1040. Once the audio output level of the speech synthesizer is adjusted, the controller 1030 instructs the power control module 1032 to power off the microphone 1012 and the audio input module 1013. The power control module 10132 may report back or indicate to the controller 1030 that the microphone 1012 and the audio input module 1013 have been powered off. In response to determining that that microphone 1012 and the audio input module 1013 have been powered off, the controller sends the alert message 1020 to the speech synthesizer so that an audible alert message corresponding to the alert message 1020 may be played over the speaker 1060.

It is sometimes desired that the audible alert message generated by the audio output expander 1200 be generated in real-time or near real-time. In such embodiments, the steps of powering up the microphone 1012, powering up the audio input module 1013, and invoking an automatic volume control procedure may delay the playback of the audible alert message generated by the speech synthesizer over the speaker 1060. In such embodiments, it is preferred that the microphone 1012 and the audio input module 1013 are powered up and that the automatic volume control procedure is invoked in advance of the need to playback an audible alert message In such embodiments, the telematics device 201 sends an AVC trigger message 1022 prior to sending the alert message 1020. The AVC trigger message 1022 indicates that an alert message 1020 may be forthcoming. In response to receiving the AVC trigger message 1022, the controller 1030 may instruct the power control module 1032 to power up the microphone 1012 and the audio input module 1013 as before. In response to determining, via a confirmation from the power control module for example, the controller 1030 invokes the automatic volume control procedure to determine the optimal audio output level of the speech synthesizer 1040. In response to determining the optimal audio output level of the speech synthesizer 1040, the controller 1030 adjusts the output level of the speech synthesizer 1040 with the optimal audio output level. As before, the controller 1030 then instructs the power control module 1032 to power down the microphone 1012 and the audio input module 1013. The telematics device 201 may send an alert message 1020 to the audio output expander 1200. In response to receiving the alert message 1020, the controller 1030 sends the alert message 1020 to the speech synthesizer 1040 for generating a corresponding audible alert message that is played back through the speaker 1060. In some cases, the telematics device 201 may send the AVC trigger message 1022, but does not send the alert message 1020, as explained below.

In the above-described embodiment, the telematics device 201 sends an AVC trigger message 1022 prior to sending the alert message 1020 to the audio output expander 1200. The AVC trigger message 1022 is thus generated based on a different condition than the alert message 1020. For example, for an alert condition a first threshold may be defined for generating the AVC trigger message 1022, and a second threshold may be defined for generating the alert message 1020. The first threshold and second threshold may be vehicle parameters, distance traveled, or duration. For example, referring back to FIG. 8, the speeding rule shown has a condition of driving over the speed limit by 10 Km/h for a duration of 20 seconds. In one embodiment, the first threshold may be driving at a speed which is only 5 Km/h over the speed limit. In this case, the telematics device 201 may send an AVC trigger message 1022 to the audio output expander 1200 as soon as the speed limit is exceeded by 10 Km/h. In this case, the audio output expander 1200 may have up to 20 seconds to enable the audio components used for detecting ambient noise for automatic volume control such as the microphone 1012 and the audio input module, and to invoke an automatic volume control procedure. If the vehicle speed remains at 10 Km/h over the speed limit for more than 20 seconds, then the telematics device 201 sends an alert message 1020 to the audio output expander 1200.

Figure 13:
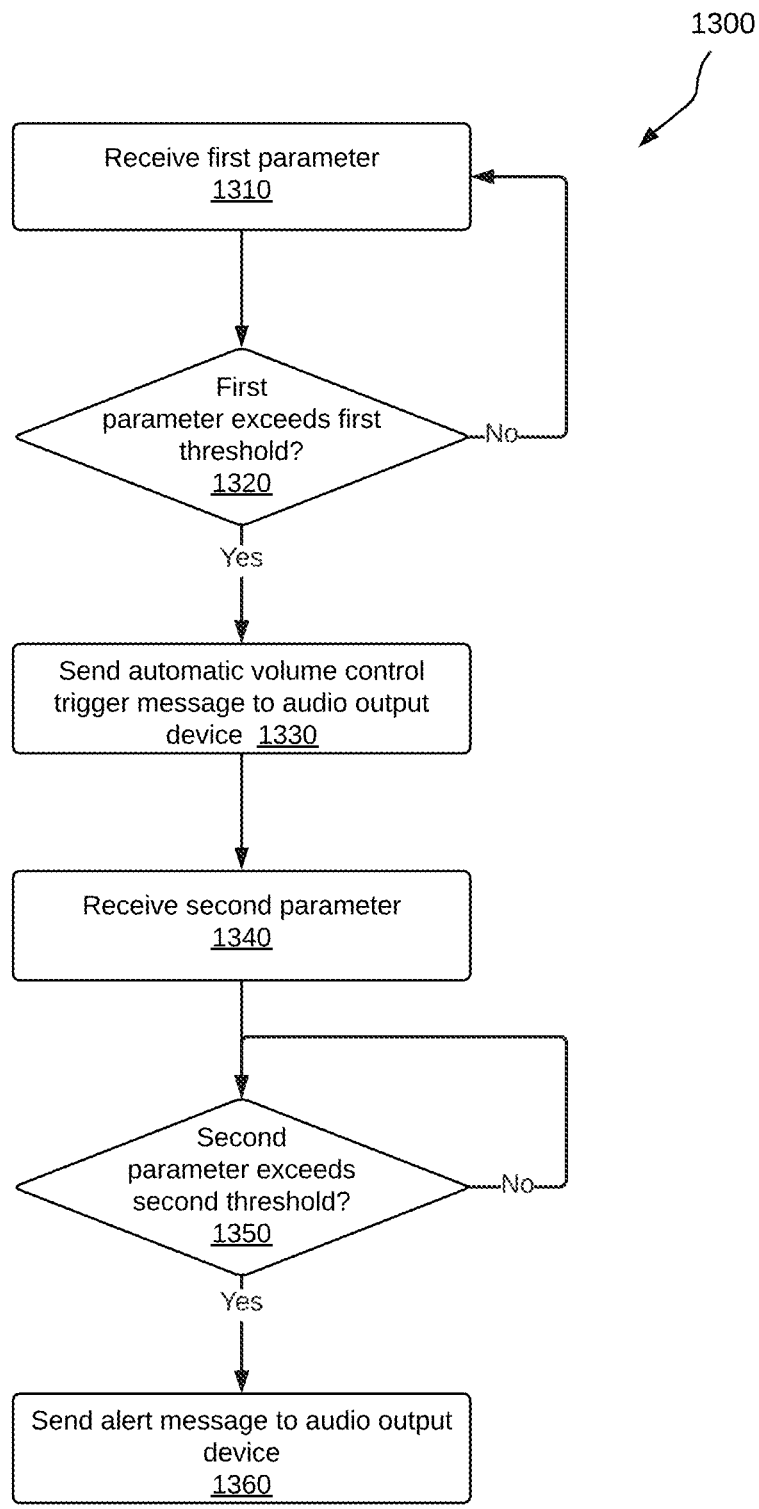
FIG. 13 is a flow chart depicting a method by a telematics device for providing an audible alert message using an audio output device, in accordance with an embodiment of the present disclosure.

FIG. 13 depicts a method 1300 by a telematics device, such as the telematics device 200 or the telematics device 201. The method 1300 starts at step 1310. At step 1310, the telematics device receives a first parameter. The first parameter may be an engine parameter which is part of the asset data 112, such as the engine RPM, ignition signal, engine load, battery voltage, seat belt use, reversing, oil pressure, or engine coolant temperature. Alternatively, the parameter may be part of the sensor data 205 gathered from the sensors 204. The sensor data 205 may include accelerometer data indicating conditions such as harsh braking, hard acceleration, or collision. The sensor data 205 may be gyroscope data or orientation information, which when combined with accelerometer data may indicate harsh cornering or impaired driving. The first parameter may also comprise location data 207 provided by the location module 206. The location data 207 may be used to determine whether the vehicle to which the telematics device is coupled has entered a zone, left a zone, is within a particular distance from a zone. The location data 207 may also indicate the current speed of the vehicle and thus indicate whether the vehicle is traveling over a particular speed or over a speed limit.

At step 1320, the telematics device compares the first parameter with a first threshold. The comparison is in accordance with the conditions set for a particular rule as discussed above. For example, if the first parameter is an engine parameter, such as the coolant temperature, the first threshold may be a temperature value that indicates a slightly elevated coolant temperature. For example, if an engine coolant temperature of 85 degrees Celsius is normal and an engine coolant temperature of 100 degrees Celsius is too hot, then the first threshold may be set at a temperature of 90 or 95 degrees Celsius. As another example, if the first parameter represents speed and a speeding rule has a condition to generate an alert when the speed is 10 Km/h over the speeding limit, then the first threshold may be set to 7 Km/h over the speeding limit. The first threshold represents a value that is close to but not equal to a second threshold that generates a notification in the form of an alert in accordance with the condition set in a rule.

If the first parameter does not exceed the first threshold, then control stays at step 1320. If the first parameter exceeds the first threshold, then control goes to step 1330.

At step 1330, sends an automatic volume control trigger message 1022 to an audio output device coupled to the telematics device, such as the audio output expander 1200. The automatic volume control trigger message 1022 may be in the form of a frame or a hardware signal. The automatic volume control trigger message 1022 causes the audio output expander 1200 to initiate an automatic volume control procedure. The automatic volume control procedure includes powering up the microphone 1012 and the audio input module 1013, reading audio input from the audio input module 1013, the audio input indicative of ambient noise, and adjusting the audio output level of the speech synthesizer 1040.

At step 1340, the telematics device receives a second parameter. In this embodiment, the second parameter is of the same type as the first parameter.

At step 1350, if the second parameter does not exceed a second threshold, then control stays in step 1350, i.e., more values of the second parameter are read. If the second parameter exceeds the second threshold then control goes to step 1360.

If a speeding rule is set to generate a notification when the vehicle speed exceeds a particular speed, and the first parameter is a vehicle speed that has exceeded a first threshold, then the second parameter may also be a vehicle speed. For example, if the rule specifies that a vehicle speed of greater than 120 Km/h should generate a notification, then the first parameter read is a speed which may be at 116 Km/h and is determined to be greater than a first threshold of 115 Km/h. The second parameter read may also be a speed so that it may be compared with a second threshold of 120 Km/h.

At step 1360 the telematics device sends a notification, for example in the form of an alert message, to the audio output device, such as the audio output expander 1200 so that the alert message may be played as an audible alert message.

In the preceding example, the first parameter and the second parameter are of the same type. In some embodiments, the first parameter and the second parameter are not of the same type. For example, consider the speeding rule of FIG. 8 which has a condition that the speed is greater than the speed limit by 10 Km/h and that this condition persists for 20 seconds. In this case, the first parameter read is the speed. However, as long as the first parameter is above the first threshold, the second parameter is time. In other words, the time from the instance at which the speed has exceeded the speed limit by 10 Km/h is the second parameter and the second threshold is 20 seconds. In this case, the first parameter has to remain above the first threshold until the second parameter has exceeded the second threshold or the notification message is not sent to the audio output device.

Figure 14:
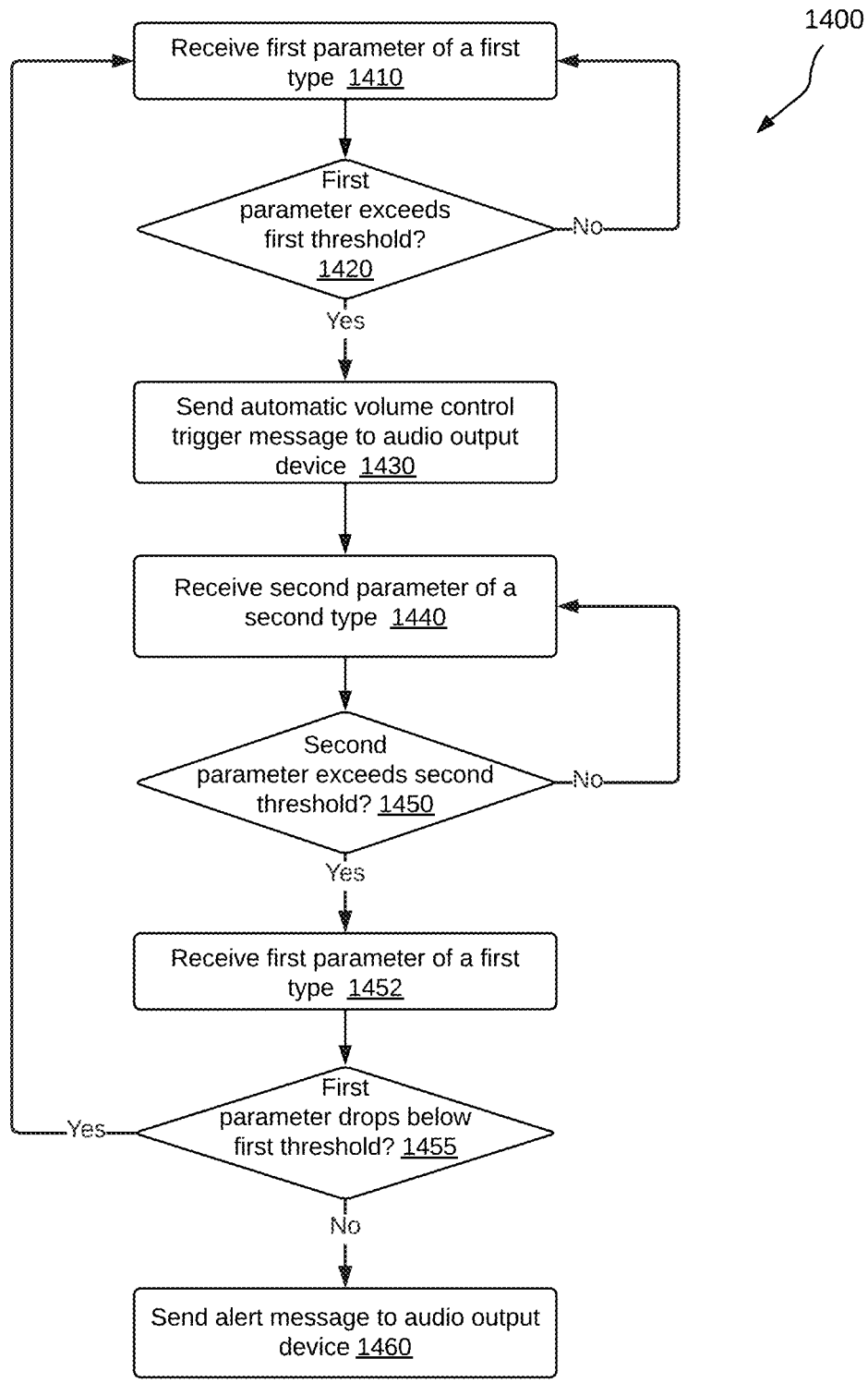
FIG. 14 is a flow chart depicting a method by a telematics device for providing an audible alert message using an audio output device, in accordance with another embodiment of the present disclosure.

An example of a method 1400 in which the first parameter and the second parameter are of different types is shown in FIG. 14.

At step 1410 the telematics device receives a first parameter of a first type. The step 1410 is similar to the step 1310 of FIG. 13; the telematics device sends an automatic volume control trigger message 1022 to an audio output device coupled to the telematics device, such as the audio output expander 1200.

At step 1420 the telematics device checks whether the first parameter has exceeded the first threshold. If the first parameter has not exceeded the first threshold, then control goes back to step 1410 to read another value of the first parameter. The steps 1410 and 1420 are repeated until the first parameter exceeds the first threshold. If the first parameter has exceeded the first threshold, then control goes to step 1430.

Step 1430 is similar to step 1330 of FIG. 13.

At step 1440, the telematics device receives a second parameter of a second type. For example, the first parameter may be a vehicle speed, while the second parameter may be a distance traveled or a duration since the first parameter has exceeded the first threshold.

At step 1450, the telematics device checks whether the second parameter of the second type has exceeded a second threshold. If the second parameter has not exceeded the second threshold, then control goes back to step 1440, where another value of the second parameter is read. The steps 1440 and 1450 are repeated until the second parameter exceeds the second threshold. If the second parameter has exceeded the second threshold, then control proceeds to step 1452.

Since the first parameter and the second parameter are of different types, it is possible that the second parameter exceeds a second threshold while the first parameter has changed in value and no longer exceeds the first threshold. This may particularly be true if it takes time for the second parameter to exceed the second threshold (i.e., if the steps 1440 and 1450 are repeated for some time until the second parameter exceeds the second threshold). During that time, the first parameter may drop below the first threshold in which case the condition of the rule that requires that the first parameter exceeds the first threshold and that the second parameter exceeds the second threshold may not be satisfied. Accordingly, in some embodiments the telematics device first verifies that the first parameter has not dropped below the first threshold. Verifying that the first parameter has not dropped below the first threshold may comprise receiving a second instance of the first parameter and comparing it with the second threshold. For example, at step 1452, the telematics device reads a second instance of the first parameter. Then at step 1455 the telematics device checks whether the first parameter has dropped below the first threshold. If the first parameter has dropped below the first threshold, then the condition for the rule will not be satisfied. Accordingly, control goes back to step 1410. If the first parameter has not dropped below the first threshold, then the condition for the rule will be satisfied. Accordingly, control goes to step 1460.

Step 1460 is similar to step 1360 of the method 1300 of FIG. 13.

Figure 15:
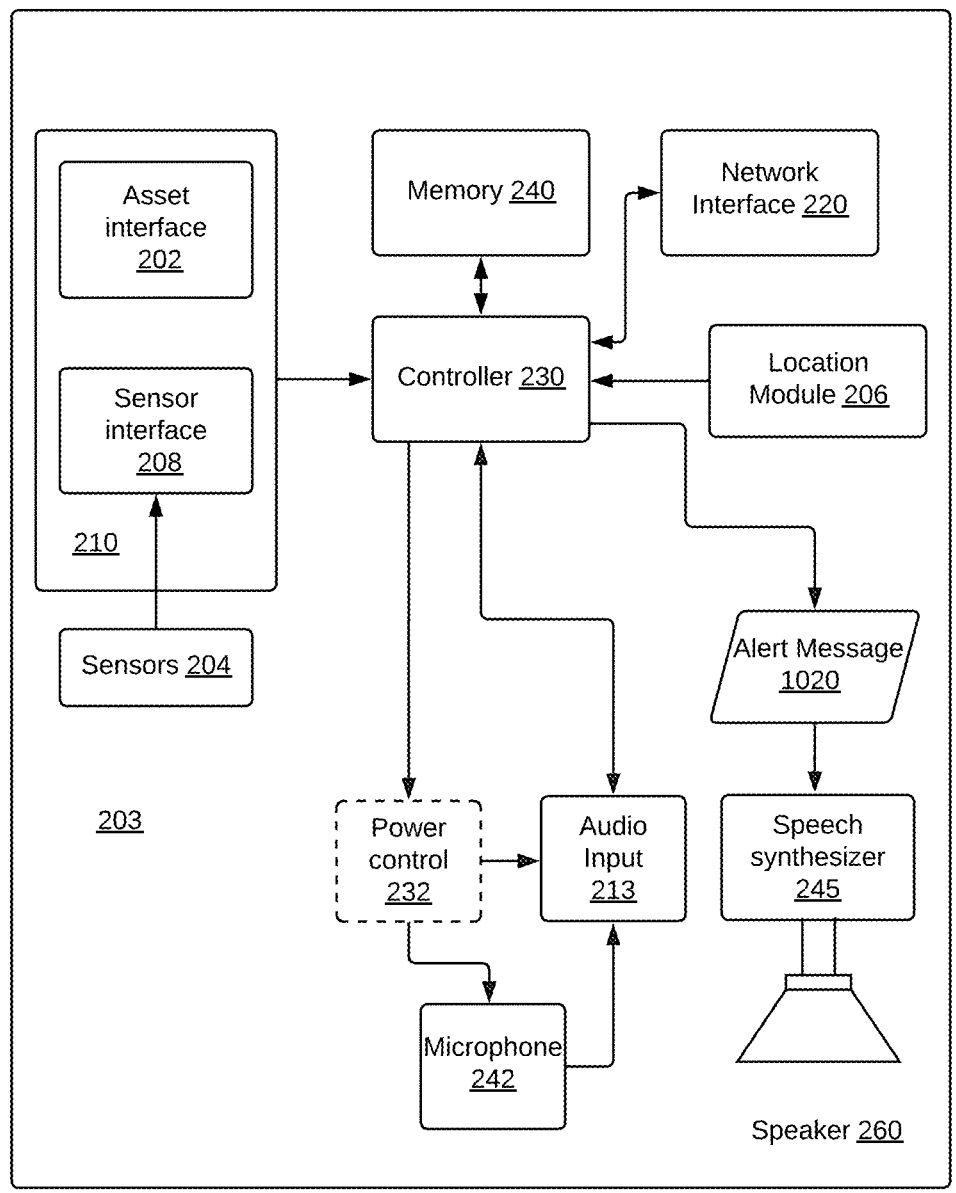
FIG. 15 is a block diagram showing a telematics device having integrated audio output components, in accordance with some embodiments of the present disclosure.

In some embodiments, the audio components are integral to the telematics device instead of being part of an audio output expander. For example, with reference to FIG. 15, there is shown a telematics device 203 having an integrated audio input module 213, an integrated power control module 232, an integrated microphone 242, an integrated speech synthesizer 245, and an integrated speaker 260. The aforementioned components have similar functionality as the audio input module 1013, the power control module 1032, the microphone 1012, the speech synthesizer 1040, and the speaker 1060.

In operation, the telematics device 203 determines that a first threshold related to a rule parameter has been exceeded. The controller 230 signals the power control module to enable both the microphone 242 and the audio input module 213. The controller 230 also executes computer programming instructions which perform an automatic volume control procedure. The microphone 242 and the audio input module 213 provide a measure of the ambient noise to the controller 230. In response, the controller 230 adjusts the audio output level of the speech synthesizer. Once the automatic volume control procedure is concluded, the controller 230 may signal the power control module 232 to power off the audio input module 213 and the microphone 242. When the telematics device 203 determines that a second threshold related to a rule parameter has been exceeded, the controller 230 sends an alert message 1020 to the speech synthesizer 245 so it may be played back over the speaker 260 as an audible alert message.

While some parameters exceed a corresponding threshold by being greater than the threshold in value, this is not necessarily the case. For example, when considering a battery undercharging condition, a normal device voltage of a battery may be 13.6 volts. If there is an alternator problem, the battery voltage may be 13V. If the undercharging condition persists, the battery voltage may drop further and reach 12.5V. In this case, the first threshold may be 13V and the second threshold may be 12.5V. In this case, it is said that the first threshold is exceeded if the battery voltage drops to 13V or lower, and that the second threshold is exceeded if the battery voltage drops to 12.5V or lower.

Embodiments have been described where the techniques are implemented in circuitry and/or computer-executable instructions. It should be appreciated that some embodiments may be in the form of a method or process, of which at least one example has been provided. The acts performed as part of the method or process may be ordered in any suitable way. Accordingly, embodiments may be constructed in which acts are performed in an order different than illustrated, which may include performing some acts simultaneously, even though shown as sequential acts in illustrative embodiments. Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

The invention claimed is:

1. A method in a telematics device coupled to a vehicle, the method comprising:
   determining that a first parameter of a first type exceeds a first threshold;
   in response to determining that the first parameter is exceeds the first threshold, sending an automatic volume control trigger message to an audio output device coupled to the telematics device;
   determining that a second parameter of a second type exceeds a second threshold; and
   in response to determining that the second parameter exceeds the second threshold, sending an alert message to the audio output device;
   wherein sending the automatic volume control trigger message comprises sending a message that causes the audio output device to power up a plurality of audio components for detecting ambient noise.

2. The method of claim 1, wherein the second type is the same as the first type.

3. The method of claim 1, wherein the second type is different from the first type.

4. The method of claim 3, further comprising determining that the first parameter has not dropped below the first threshold in response to determining that the second parameter exceeds the second threshold.

5. The method of claim 4, wherein determining that the first parameter has not dropped below the first threshold comprises reading the first parameter and comparing the first parameter against the first threshold.

6. The method of claim 1, wherein determining that the first parameter exceeds the first threshold comprises determining that a value of the first parameter is greater than the first threshold.

7. The method of claim 1, wherein determining that the first parameter exceeds the first threshold comprises determining that a value of the first parameter is lower than the first threshold.

8. The method of claim 2, wherein determining that the second parameter exceeds the second threshold comprises determining that the second parameter exceeds the first threshold.

9. The method of claim 1, wherein determining that the first parameter exceeds the first threshold comprises receiving the first parameter and comparing the first parameter against the first threshold.

10. The method of claim 1, wherein determining that the second parameter exceeds the second threshold comprises receiving the second parameter and comparing the second parameter against the second threshold.

11. The method of claim 1, wherein the plurality of audio components for detecting ambient noise comprise a microphone and an audio input module.

12. The method of claim 1, wherein the message that causes the audio output device to power up the plurality of audio components for detecting ambient noise also invokes an automatic volume control procedure for adjusting an audio output level of the audio output device.

13. The method of claim 12, wherein adjusting the audio output level of the audio output device comprises adjusting the audio output level of a speech synthesizer that converts the alert message to an audible alert message.

14. A telematics device, comprising:
   a) a controller;
   b) an asset interface coupled to the controller; and
   c) a memory coupled to the controller, the memory storing machine-executable instructions which, when executed by the controller, configure the telematics device to:
      i. determine that a first parameter of a first type exceeds a first threshold;
      ii. in response to determining that the first parameter is greater than the first threshold, send an automatic volume control trigger message to an audio output device coupled to the telematics device;
      iii. determine that a second parameter of a second type exceeds a second threshold; and
      iv. in response to determining that the second parameter exceeds the second threshold, send an alert message to the audio output device;
      wherein the automatic volume control trigger message comprises a message that causes the audio output device to power up a plurality of audio components for detecting ambient noise.

15. A method in a telematics system including a telematics device and an audio output device coupled to the telematics device, the method comprising:
   determining, by the telematics device, that a first parameter of a first type exceeds a first threshold;
   in response to determining that the first parameter exceeds the first threshold, sending, by the telematics device, an automatic volume control trigger message to the audio output device;
   receiving the automatic volume control trigger message at the audio output device;
   invoking, at the audio output device, an automatic volume control procedure in response to receiving the automatic volume control trigger message;
   determining, by the telematics device, that a second parameter of a second type exceeds a second threshold;
   in response to determining that the second parameter exceeds the second threshold, sending, by the telematics device, an alert message to the audio output device;
   receiving the alert message at the audio output device; and
   playing, by the audio output device, an audible alert message based on the alert message;
   wherein invoking the automatic volume control procedure comprises:
   powering up a plurality of audio components for detecting ambient noise; and
   adjusting an audio output level of the audio output device based on the ambient noise.

16. The method of claim 15, wherein playing the audible alert message based on the alert message comprises providing the alert message to a speech synthesizer of the audio output device.

17. The method of claim 15, wherein the audio output device comprises an audio output expander coupled to the telematics device via an input/output expander interface.

* * * * *